(12) United States Patent
Sapone

(10) Patent No.: US 9,147,660 B2
(45) Date of Patent: Sep. 29, 2015

(54) CHIP TO PACKAGE INTERFACE

(71) Applicant: Infineon Technologies AG, Neubiberg (DE)

(72) Inventor: Giuseppina Sapone, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/511,472

(22) Filed: Oct. 10, 2014

(65) Prior Publication Data

US 2015/0024554 A1    Jan. 22, 2015

Related U.S. Application Data

(62) Division of application No. 13/612,547, filed on Sep. 12, 2012, now Pat. No. 8,890,319.

(51) Int. Cl.

| | |
|---|---|
| H01L 23/00 | (2006.01) |
| H01L 21/56 | (2006.01) |
| H01L 23/66 | (2006.01) |
| H01L 23/31 | (2006.01) |
| H01L 23/538 | (2006.01) |
| H01L 23/64 | (2006.01) |
| H01L 23/522 | (2006.01) |
| H01L 23/498 | (2006.01) |
| H01F 19/04 | (2006.01) |
| H01F 27/28 | (2006.01) |

(52) U.S. Cl.
CPC ............... *H01L 23/66* (2013.01); *H01L 21/56* (2013.01); *H01L 21/561* (2013.01); *H01L 21/568* (2013.01); *H01L 23/3121* (2013.01); *H01L 23/5227* (2013.01); *H01L 23/5389* (2013.01); *H01L 23/645* (2013.01); *H01L 24/03* (2013.01); *H01L 24/19* (2013.01); *H01F 19/04* (2013.01); *H01F 27/2804* (2013.01); *H01L 23/49816* (2013.01); *H01L 2223/6677* (2013.01); *H01L 2224/0231* (2013.01); *H01L 2224/0401* (2013.01); *H01L 2224/04105* (2013.01); *H01L 2224/12105* (2013.01); *H01L 2924/10253* (2013.01); *H01L 2924/13091* (2013.01)

(58) Field of Classification Search
CPC ..... H01L 23/66; H01L 23/3121; H01L 23/00; H01L 23/31; H01L 21/56; H01L 24/03; H01L 2224/0231; H01L 2224/04105; H01L 2924/13091; H01L 2924/10253; H01L 2223/6677
See application file for complete search history.

(56) References Cited

U.S. PATENT DOCUMENTS

| | | |
|---|---|---|
| 5,519,582 A | 5/1996 | Matsuzaki |
| 2004/0056749 A1 | 3/2004 | Kahlmann et al. |

(Continued)

OTHER PUBLICATIONS

Trotta, S., et al., "An RCP Packaged Transceiver Chipset for Automotive LRR and SRR Systems in SiGe BiCMOS Technology," IEEE TRansactions on Microwave Theory and Techniques, vol. 60, Mar. 2012, pp. 778-794.

(Continued)

*Primary Examiner* — Peniel M Gumedzoe
(74) *Attorney, Agent, or Firm* — Slater & Matsil, L.L.P.

(57) ABSTRACT

In accordance with an embodiment of the present invention, a semiconductor package includes a semiconductor chip disposed within an encapsulant, and a first coil disposed in the semiconductor chip. A dielectric layer is disposed above the encapsulant and the semiconductor chip. A second coil is disposed above the dielectric layer. The first coil is magnetically coupled to the second coil.

30 Claims, 18 Drawing Sheets

(56) References Cited

U.S. PATENT DOCUMENTS

| | | |
|---|---|---|
| 2009/0267084 A1 | 10/2009 | Bilger et al. |
| 2009/0309688 A1 | 12/2009 | Kawano |
| 2010/0265024 A1 | 10/2010 | Nakashiba |
| 2012/0086102 A1* | 4/2012 | Hofmann et al. ............. 257/531 |
| 2012/0161279 A1* | 6/2012 | Lin et al. ....................... 257/531 |
| 2012/0181874 A1 | 7/2012 | Willkofer et al. |

OTHER PUBLICATIONS

Wojnowski, M., et al., "A 77 GHz SiGe Mixer in an Embedded Wafer Level BGA Package," Electronic Components and Technology Conference, 2008, 7 pages.

Aboushady, H., "Differential Amplifiers," University of Paris VI, created Nov. 4, 2007, 15 pages.

* cited by examiner

CHIP TO PACKAGE INTERFACE

The present application is a divisional application of application Ser. No. 13/612,547 filed on Sep. 12, 2012, which is incorporated herein by reference.

TECHNICAL FIELD

The present invention relates generally to semiconductor packages, and more particularly to chip to package interfaces.

BACKGROUND

Recently, interest in the millimeter-wave spectrum at 30 GHz to 300 GHz has drastically increased. The emergence of low cost high performance Si-based technologies has opened a new perspective for system designers and service providers because it enables the development of millimeter-wave radio at the same cost structure of radios operating in the gigahertz range or less. In combination with available ultra-wide bandwidths, this makes the millimeter-wave spectrum more attractive than ever before for supporting a new class of systems and applications ranging from ultra-high speed data transmission, video distribution, portable radar, sensing, detection and imaging of all kinds.

However, taking advantage of the millimeter-wave radio spectrum requires the ability to design and manufacture low cost, high performance RF-front-ends for millimeter-wave semiconductor devices.

SUMMARY OF THE INVENTION

In accordance with an embodiment of the present invention, a semiconductor package comprises a semiconductor chip disposed within an encapsulant. A first coil is disposed in the semiconductor chip. A dielectric layer is disposed above the encapsulant and the semiconductor chip. A second coil is disposed above the dielectric layer. The first coil is magnetically coupled to the second coil.

In accordance with an alternative embodiment of the present invention, a semiconductor device comprises a first coil of a transformer disposed within a semiconductor chip, and a second coil of the transformer disposed within an insulating material outside the semiconductor chip. The first and the second coils form the transformer.

In accordance with an alternative embodiment of the present invention, a method of forming a semiconductor package comprises forming a semiconductor chip having a first coil disposed in an uppermost metal level. A reconstituted wafer comprising the semiconductor chip is formed. A dielectric layer is formed over the reconstituted wafer. A second coil is formed over the dielectric layer. The second coil is configured to magnetically couple with the first coil.

BRIEF DESCRIPTION OF THE DRAWINGS

For a more complete understanding of the present invention, and the advantages thereof, reference is now made to the following descriptions taken in conjunction with the accompanying drawing, in which:

FIG. 2, which includes FIG. 2A-2D, illustrates a semiconductor package for millimeter wave integrated circuits in accordance with embodiments of the present invention, wherein FIG. 2A illustrates a sectional top view while FIGS. 2B-2D illustrate different cross-sectional views;

FIG. 4, which includes

FIG. 5, which includes

FIG. 6, which includes FIGS. 6A-6C, illustrates a semiconductor substrate after formation of device regions and metallization layers during fabrication of the semiconductor package in accordance with an embodiment of the invention, wherein FIGS. 6A and 6B illustrates a cross-sectional view and FIG. 6C illustrates a top view;

FIG. 16, which includes

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of various embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Many applications based on wireless transmission at millimeter wave frequencies may need a package structure that protects the components within the package from mechanical and environmental stress without significantly increasing packaging costs. Further, signal loss introduced by the transition from the printed circuit board to the chip receiver/transmitter interface of the semiconductor package may limit performance of millimeter wave semiconductor chips. This problem is exacerbated when the signal transition from the millimeter wave integrated circuit chip to the printed circuit board is single ended because of losses due to the signal return path. Differential signals, which are measured between two nodes that have equal and opposite excursions around a common mode potential, in contrast, are more immune to common mode noise. However, a single ended signal interface is less complex to route on the printed circuit board. In various embodiments, these and other problems are solved using a millimeter wave embedded wafer level semiconductor package which includes a transformer for providing a single ended package input/output to the board while enabling the use of a differential signal interface at the chip.

A schematic layout of the semiconductor package will be described using FIG. 1. Alternative layouts will be described using FIGS. 16 and 17. Structural embodiments of the semiconductor package will be described using FIGS. 2-5. Embodiments of fabricating the semiconductor package will be described using FIGS. 6-15.

Figure 1:
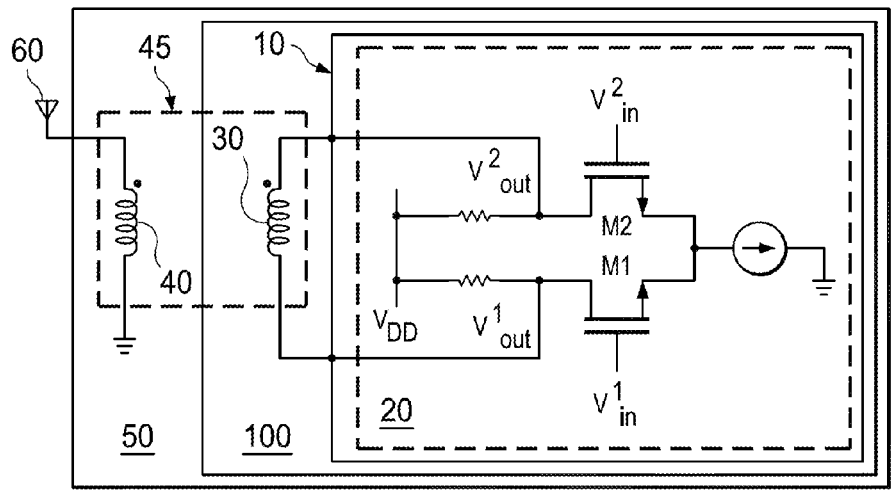
FIG. 1 illustrates a schematic of a millimeter wave semiconductor package in accordance with an embodiment.

FIG. 1 illustrates a millimeter wave semiconductor package in accordance with an embodiment.

Referring to FIG. 1, a semiconductor package 50 includes a semiconductor chip 100, which includes a front-end circuit 10 for a transmitter or a receiver. The front-end circuit 10 is coupled to an antenna 60 through a transformer 45. The transformer 45 includes a first coil 30, which is part of the semiconductor chip 100 and a second coil 40 which is outside the semiconductor chip 100 but is part of the semiconductor package 50. The antenna 60 may be part of the semiconductor package 50 or may be a separate unit coupled to the semiconductor package 50 through a printed circuit board.

As illustrated, the semiconductor package 50 has a single ended input/output, which is coupled to the antenna 60. A single ended signal interface may be easily routed on the printed circuit board unlike a double ended signal path. In contrast to alternative solutions such as the use of the on-chip balun to enable a single ended chip input/output, which result in significant losses (e.g., greater than 1 dB) that sum-up with the losses of the chip-to-package connection, embodiments of the invention have much lower overall signal loss through the package. Advantageously, in various embodiments of the present invention, the chip interface is not single ended minimizing signal loss while in contrast the package interface is single ended which helps to minimize complexity at the printed circuit board level. The antenna 60 may also be part of the printed circuit board in other embodiments.

In various embodiments, the signal transfer from the semiconductor chip 100 to the semiconductor package 50 is implemented using a stacked transformer 45, which acts as a balun, with an on-chip differential coil (first coil 30) and an on-package single ended coil (second coil 40). Advantageously, the first coil 30 (on-chip differential coil) provides a fully differential connection toward the chip stages, while the second coil 40 (upper on-package coil) provides direct single-ended connection to the printed circuit board. Consequently, embodiments of the invention provide on-chip differential circuits with high common-mode immunity and simple routing on the printed circuit board. As will be described in more detail, embodiments of the invention may be applied to either or both receiver and transmitter chip-in-package millimeter wave designs.

As illustrated, the front-end circuit 10 may include a differential signal circuit 20, which may include a MOSFET differential pair in one embodiment. The MOSFET differential pair comprises a first transistor M1 and a corresponding second transistor M2 coupled to a common source node. The MOSFET differential pair has a first input voltage node $V^1_{in}$ and a second input voltage node $V^2_{in}$ thereby forming a differential input, and a first output voltage node $V^1_{out}$ and a second output voltage node $V^2_{out}$ thereby forming a differential output. As a consequence, the maximum and minimum voltage levels are well defined and independent of the input common mode. In various embodiments, the device parameters for the first transistor M1 and the second transistor M2 are identical. The transistors are biased using a common current source, and to a supply voltage VDD through the resistors.

Figure 2A:
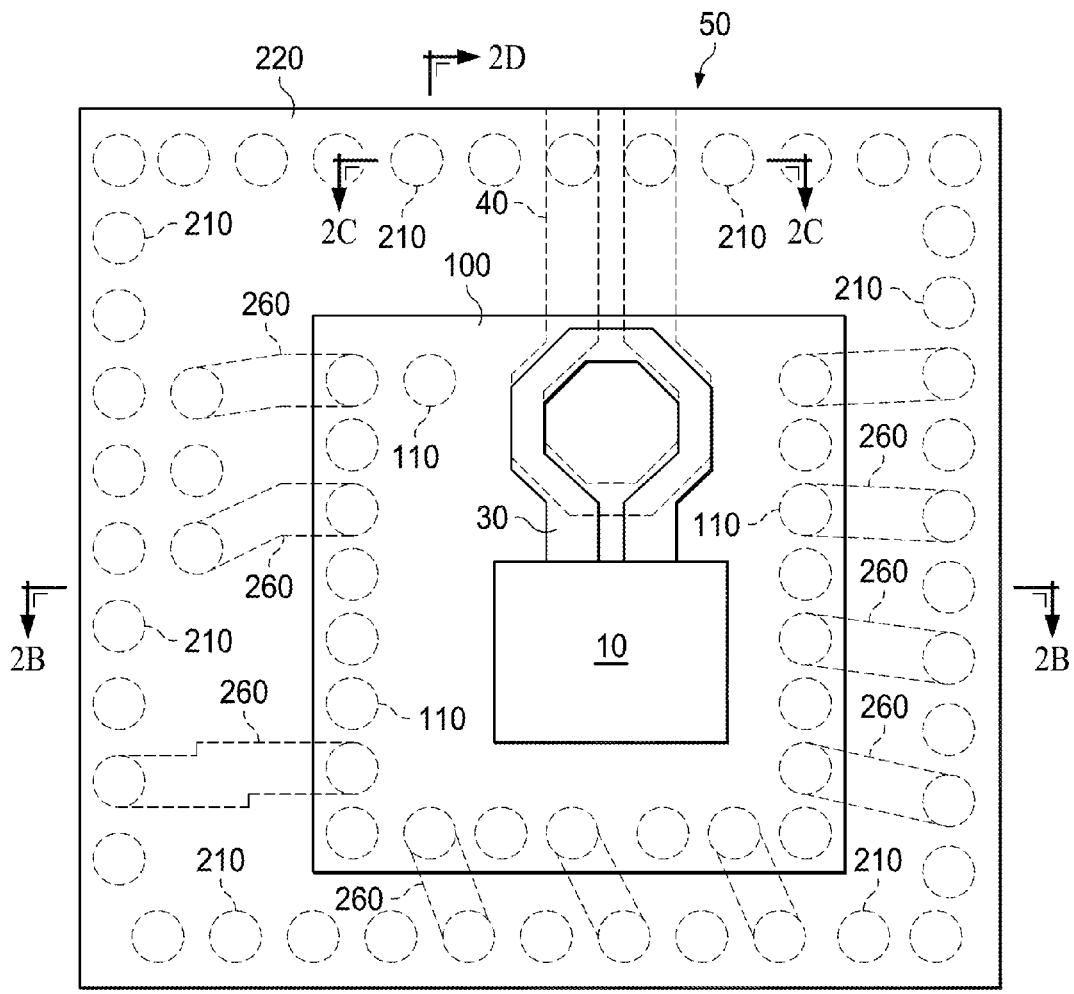
Figure 2B:
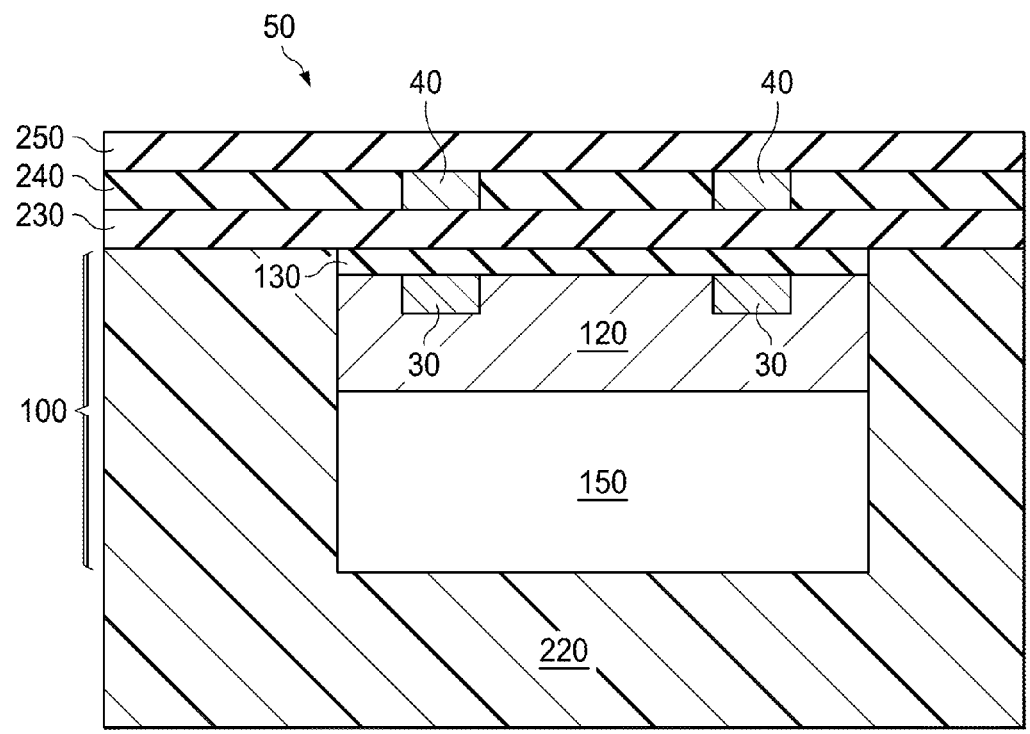
Figure 2C:
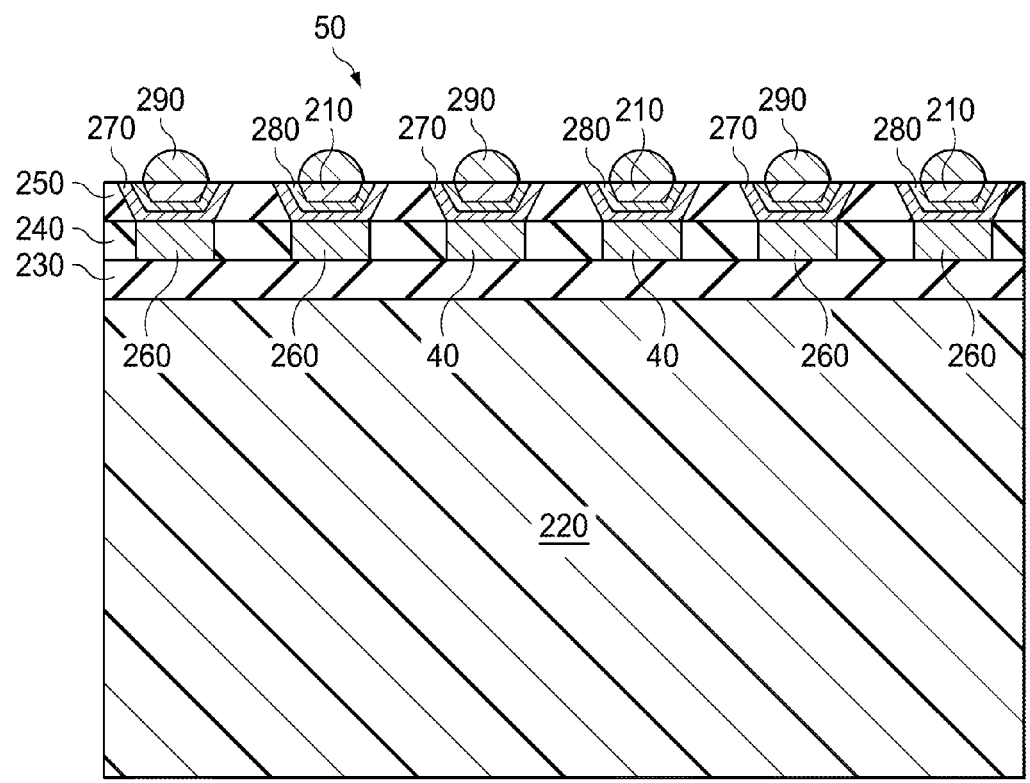
Figure 2D:
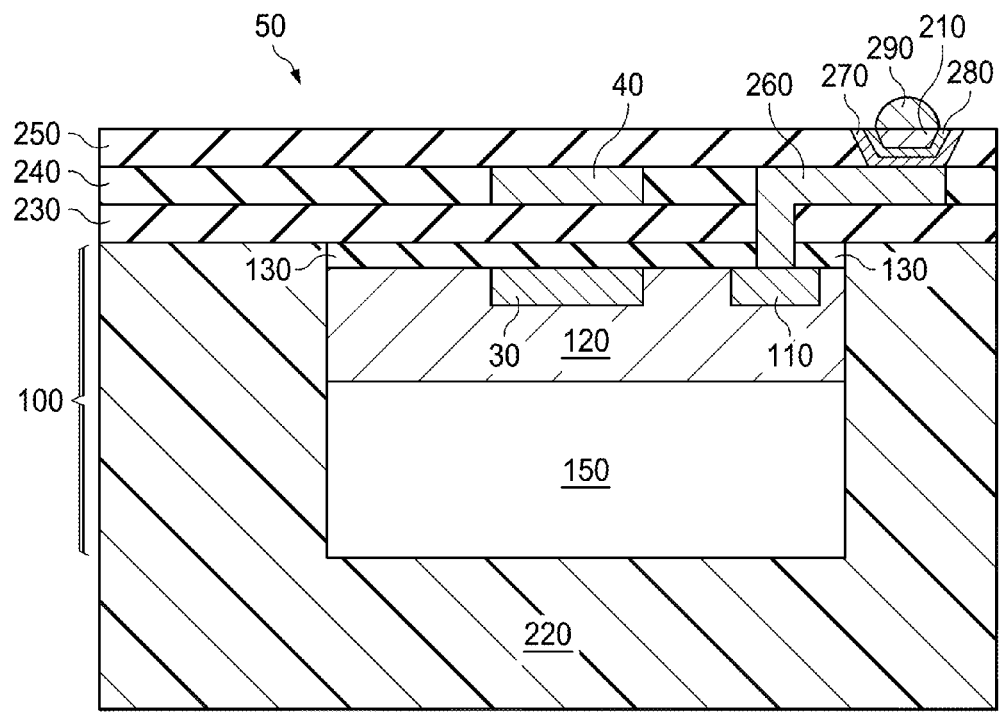

FIG. 2, which includes FIG. 2A-2D, illustrates a semiconductor package for millimeter wave integrated circuits in accordance with embodiments of the present invention. FIG. 2A illustrates a sectional top view while FIGS. 2B-2D illustrate different cross-sectional views. FIG. 2 is one implementation of the semiconductor circuit illustrated in FIG. 1.

Referring to FIG. 2A, a semiconductor package 50 includes a chip 100 disposed within. The chip 100 includes a plurality of contact pads 110 disposed on a main surface. The semiconductor package 50 is an embedded wafer level semiconductor package in one or more embodiments. Further, the semiconductor package 50 is a fan-out package having a plurality of external contact pads 210.

Embedded wafer level packaging is an enhancement of the standard wafer level packaging in which the packaging is realized on an artificial wafer. In a fan-out type package, some of the external contact pads 210 and/or conductor lines connecting the semiconductor chip 100 to the external contact pads 210 are located laterally outside of the outline of the semiconductor chip 100 or at least intersect the outline of the semiconductor chip 100. Thus, in fan-out type packages, a peripherally outer part of the package of the semiconductor chip 100 is typically (additionally) used for electrically bonding the semiconductor package 50 to external applications, such as application boards, etc. This outer part of the semiconductor package 50 encompassing the semiconductor chip 100 effectively enlarges the contact area of the semiconductor package 50 in relation to the footprint of the semiconductor chip 100, thus leading to relaxed constraints in view of package pad size and pitch with regard to later processing, e.g., second level assembly.

A first coil 30 is disposed within the semiconductor chip 100 at a top surface and coupled to the front-end circuit 10 (see also FIG. 2B). A second coil 40 is disposed over the semiconductor chip 100 and coupled to the plurality of external contact pads 210 of the semiconductor package 50. Further, a plurality of redistribution lines 260 couple the plurality of contact pads 110 on the semiconductor chip 100 with the plurality of external contact pads 210 on the semiconductor package 50.

FIG. 2B illustrates a cross-sectional view of the semiconductor package in accordance with an embodiment of the present invention.

Referring to FIG. 2B, the semiconductor chip 100 is disposed within an encapsulant 220. The semiconductor chip 100 comprises a substrate 150, which may include active devices formed within. The metallization layer stack 120 is disposed over the substrate 150. Metallization layer stack 120 may comprise a number of metal levels in various embodiments, for example, the metallization layer stack 120 may comprise ten or more metal levels in one embodiment. In another embodiment, the metallization layer stack 120 may comprise four or more metal levels.

A first coil 30 is disposed within the metallization layer stack 120. In one embodiment, the first coil 30 is disposed within an uppermost metal level of the metallization layer stack 120.

A passivation layer 130 is disposed over the metallization layer stack 120. The passivation layer 130 is configured to protect the underlying metallization layer stack 120. The passivation layer 130 may comprise an oxide such as silicon oxide in one or more embodiments. In alternative embodiments, the passivation layer 130 may comprise a nitride material. In further embodiments, the passivation layer 130 may comprise other dielectric materials such as high-k or even low-k materials.

As illustrated, the encapsulant 220 surrounds the sidewalls of the semiconductor chip 100. A first dielectric layer 230 is disposed over the encapsulant 220 and the semiconductor chip 100. A second dielectric layer 240 is disposed over the first dielectric layer 230. A third dielectric layer 250 is disposed over the second dielectric layer 240. The first, second, and the third dielectric layers 230, 240, and 250 may comprise a same or different material in different embodiments.

A second coil 40 is disposed within the second dielectric layer 240. The second coil 40 is separated from the first coil 30 by the first dielectric layer 230 and the passivation layer 130. Advantageously, in various embodiments of the invention, the signal coupling between the first coil 30 and the second coil 40 is performed by means of the interposed dielectric that is formed partly during the fabrication of the chip 100 (passivation layer 130) and partly during the fabrication of the semiconductor package 50 (first dielectric layer 230). Thus, in various embodiments, the separation between the first coil 30 and the second coil 40 may be controlled either during the chip fabrication process or subsequently during the embedded wafer level processing. Thus, the signal coupling may be controlled tightly in various embodiments of the present invention.

Referring to FIG. 2C, a plurality of redistribution lines 260 is disposed in the second dielectric layer 240. The plurality of redistribution lines 260 are metal lines that couple the plurality of contact pads 110 with a plurality of external contact pads 210 of the semiconductor package 50.

The plurality of external contact pads 210 may include a first conductive liner 270 such as a diffusion barrier layer. The first conductive liner 270 may be formed over the plurality of redistribution lines 260 and sidewalls of the opening in the third dielectric layer 250. A second conductive liner 280 may be formed over the first conductive liner 270. The second conductive liner 280 may be an under bump metallization layer (UBM) layer. A solder ball 290 is disposed on the second conductive liner 280. Thus, the solder balls 290 may be mounted onto a printed circuit board. The solder balls 290 may comprise solder materials such as lead-tin materials. Similarly, in another embodiment, the solder balls 290 may comprise lead free solder materials such as 97.5 Sn/2.6 Ag (97.5/2.5). In various embodiments, the first and the second conductive liners 270 and 280, and the solder balls 290 may comprise any suitable solder material. For example, in one embodiment, the solder material may comprise a lead (Pb) layer followed by a tin (Sn) layer. In another embodiment, a SnAg may be deposited as the solder material. Other examples include SnPbAg, SnPb, PbAg, PbIn, and lead free materials such as SnBi, SnAgCu, SnTn, and SiZn. In various embodiments, other suitable materials may be deposited.

FIG. 2D illustrates a different cross-sectional view showing the first coil 30, the second coil 40, a redistribution line of the plurality of redistribution lines 260 coupled to one of the plurality of contact pads 110 on the chip 100 and to one of the plurality of external contact pads 210.

Advantageously, in various embodiments, both the first and the second coils 30 and 40 are far removed away from the substrate 150 in contrast to on-chip transformer coils, thus reducing signal losses towards the substrate 150. In various embodiments, the chip to board transition loss (including also conversion from the differential signal to single ended signal) may be lower than 2 dB at 80 GHz.

Also in various embodiments, the on chip signal pads may not be needed because the signal coupling is electromagnetic, as illustrated in FIG. 2A. This is big benefit at mm-wave frequencies because the capacitance introduced by the on-chip pad on the signal path has a low-pass behavior and therefore has a negative impact on the signal transfer. In such cases, the capacitance, which may range from 40 fF to 80 fF depending on the technology, is compensated by shunt resonance with an on-chip stub connected between the pad and ground. However, the compensation has to be frequency selective to provide a high-ohmic impedance over the operating frequency.

The elimination of the on-chip signal pads using embodiments of the invention provides more flexibility in the layout of the interface, which can be further optimized according to transition performance and taking into account only chip and package geometrical layout constraints, without limitations introduced by other devices. For example, a typical layout limitation is given by the fixed gap between the chip pad pitch (distance between adjacent pads of the plurality of contact pads 110 on the chip 100, e.g., which is about 100 μm to about 150 μm) and the package pad pitch (distance between adjacent pads of the plurality of external contact pads 210, e.g., which is about 400 μm to about 500 μm). This big difference between the chip pad pitch and the package pad pitch is partly responsible of the length of the redistribution lines 260, which is directly proportional to the losses.

Further, advantageously, the absence of physical contact by metallization layers between the semiconductor package 50 and the chip 100 at the mm-wave front-end interface may enhance the robustness of the mm-wave interface of the packaged device against mechanical and/or environmental stresses and aging. Also, the electromagnetic coupling at the chip-package interface automatically implements an electrostatic discharge protection device, avoiding the need to adopt other on-chip protection structure that occupy silicon area and deteriorate the performance of the mm-wave signal.

Figure 3:
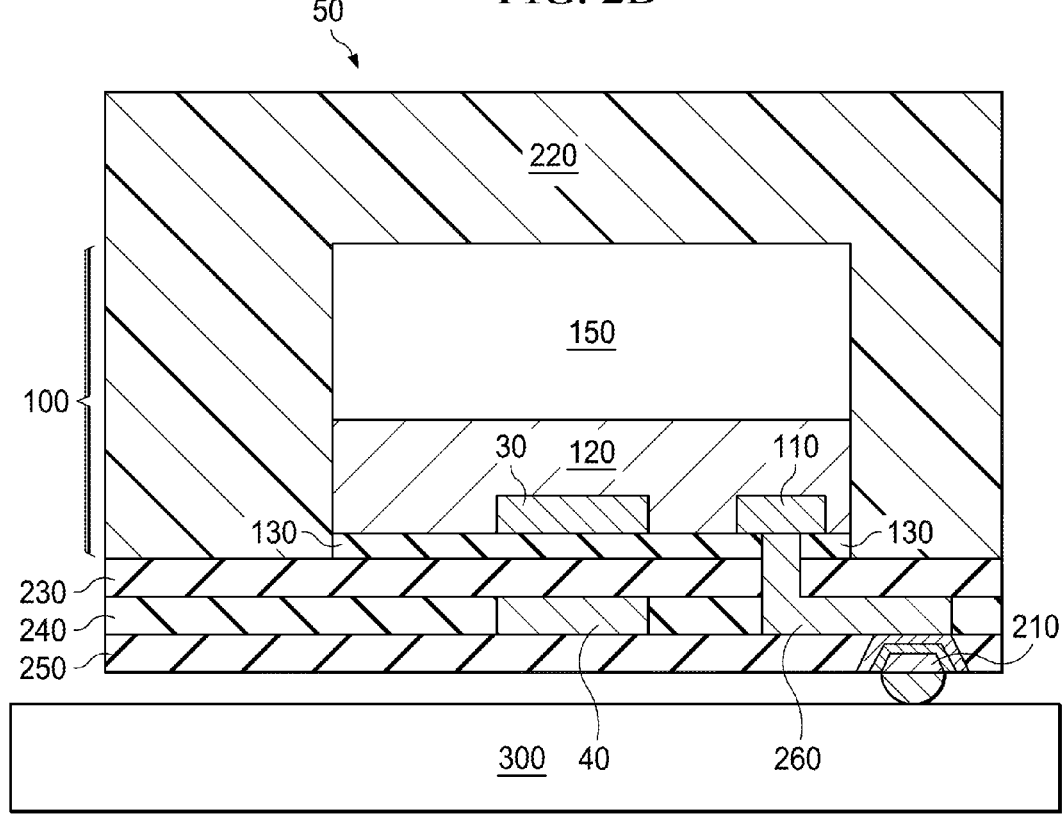
FIG. 3 illustrates a mm-wave semiconductor package mounted on a printed circuit board in accordance with an embodiment of the present invention.

FIG. 3 illustrates an mm-wave semiconductor package mounted on a printed circuit board in accordance with an embodiment of the present invention.

The semiconductor package 50 is mounted on to a circuit board 300 using the plurality of external contact pads 210. The circuit board 300 may include the antenna (illustrated in FIG. 1) or alternatively a discrete antenna may be mounted on the circuit board 300.

Figure 4A:
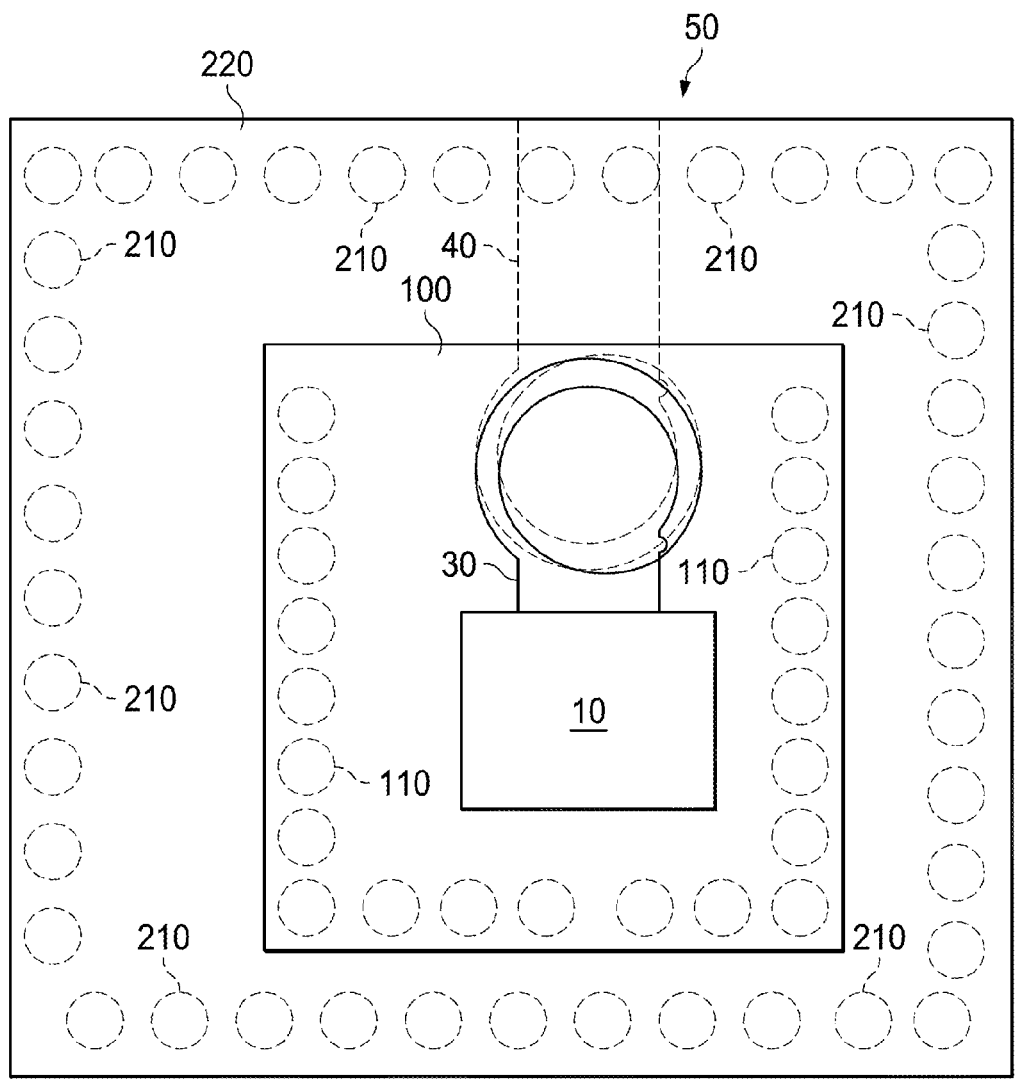
FIGS. 4A-4C, illustrates a semiconductor package in accordance with alternative embodiments of the present invention.
Figure 4B:
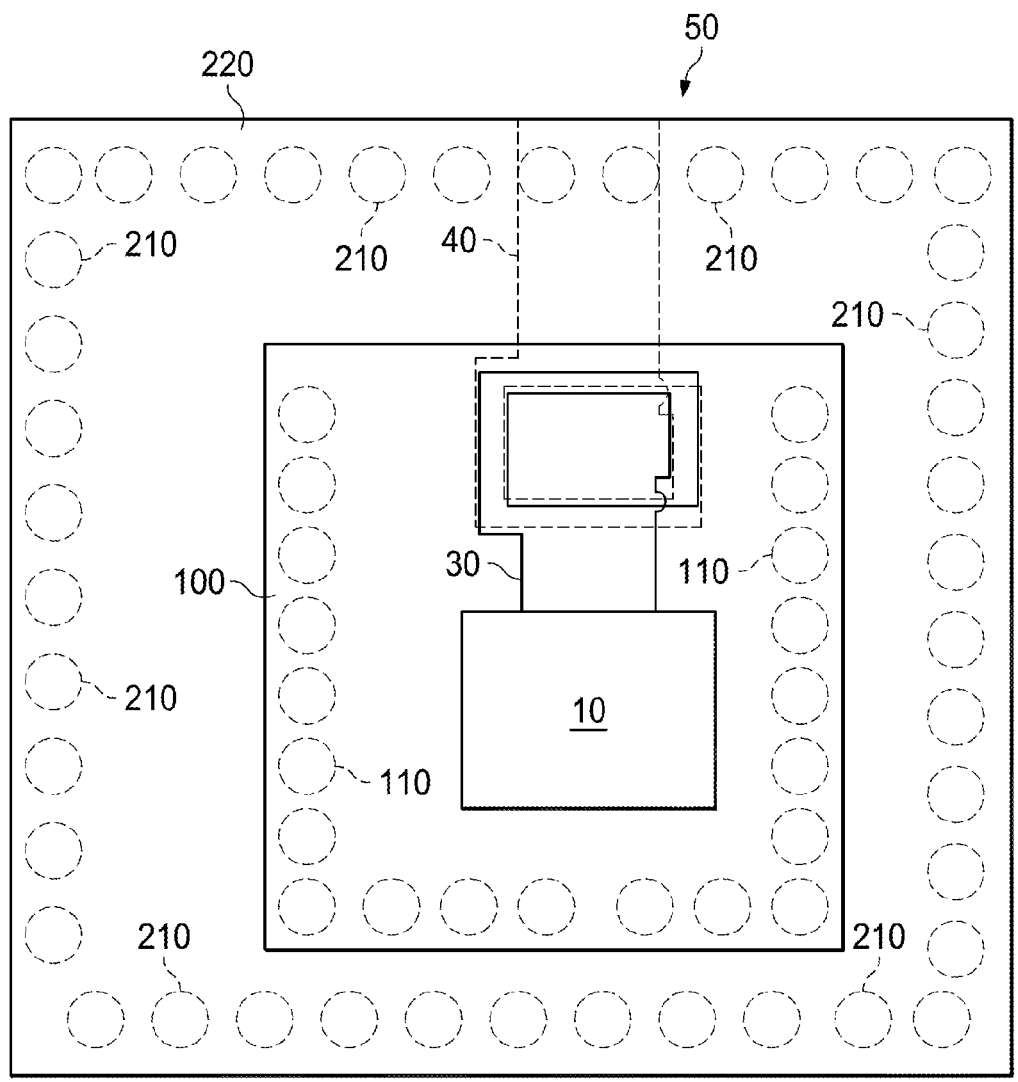
Figure 4C:
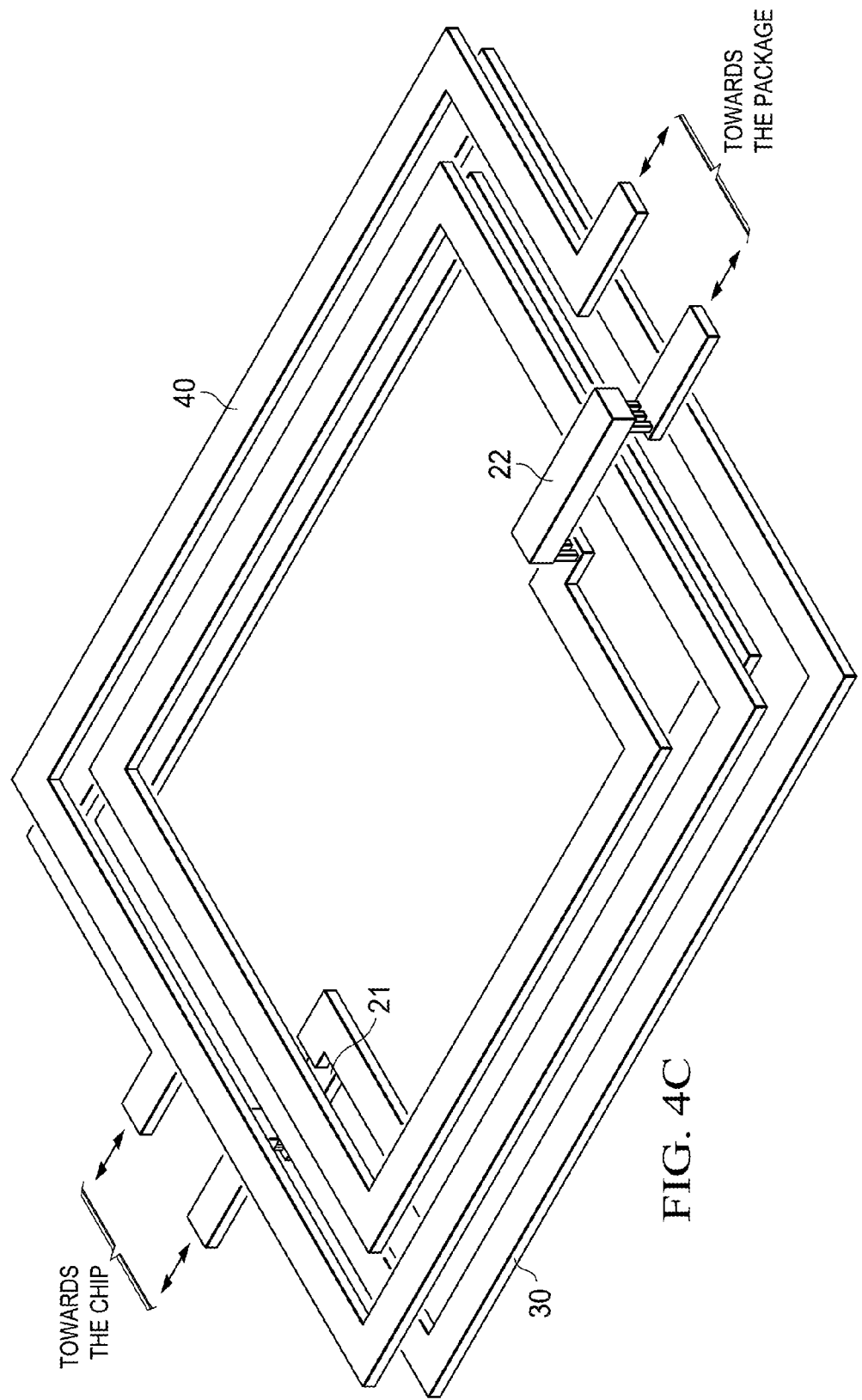

FIG. 4, which includes FIGS. 4A-4C, illustrates the semiconductor package in accordance with alternative embodiments of the present invention. FIG. 4A-4B illustrate top view while FIG. 4C illustrates a 3D drawing of an embodiment of the transformer.

In various embodiments, the semiconductor package 50 may include transformer coils having different configurations such as multiple coils or multiple turn or multiple loop coils. FIG. 4A illustrates an embodiment in which the first coil 30 and the second coil 40 are configured with multiple loops. In this embodiment, the first coil 30 and the second coil 40 have a spiral shape. FIG. 4B illustrates a different alternative shape of the first and the second coils 30 and 40. In FIG. 4B, the first coil 30 and the second coil 40 have a rectangular shaped coil. FIG. 4C illustrates a 3D view of the first coil 30 and the second coil 40 comprising rectangular coils sketched in FIG. 4B in another alternative embodiment of the invention. As illustrated, the first coil 30 may have an underpass 21 within the metallization layer stack 120. Through the underpass 21, the first coil 30 may be coupled to input/output nodes within the chip 100 while the second coil 40 may have an overpass 22, which may be coupled to the plurality of external contact pads 210 of the semiconductor package 50.

FIG. 5, which includes FIGS. 5A-5E, illustrates an alternative embodiment of the semiconductor package in which the transformer coils are formed over multiple metal levels.

Figure 5A:
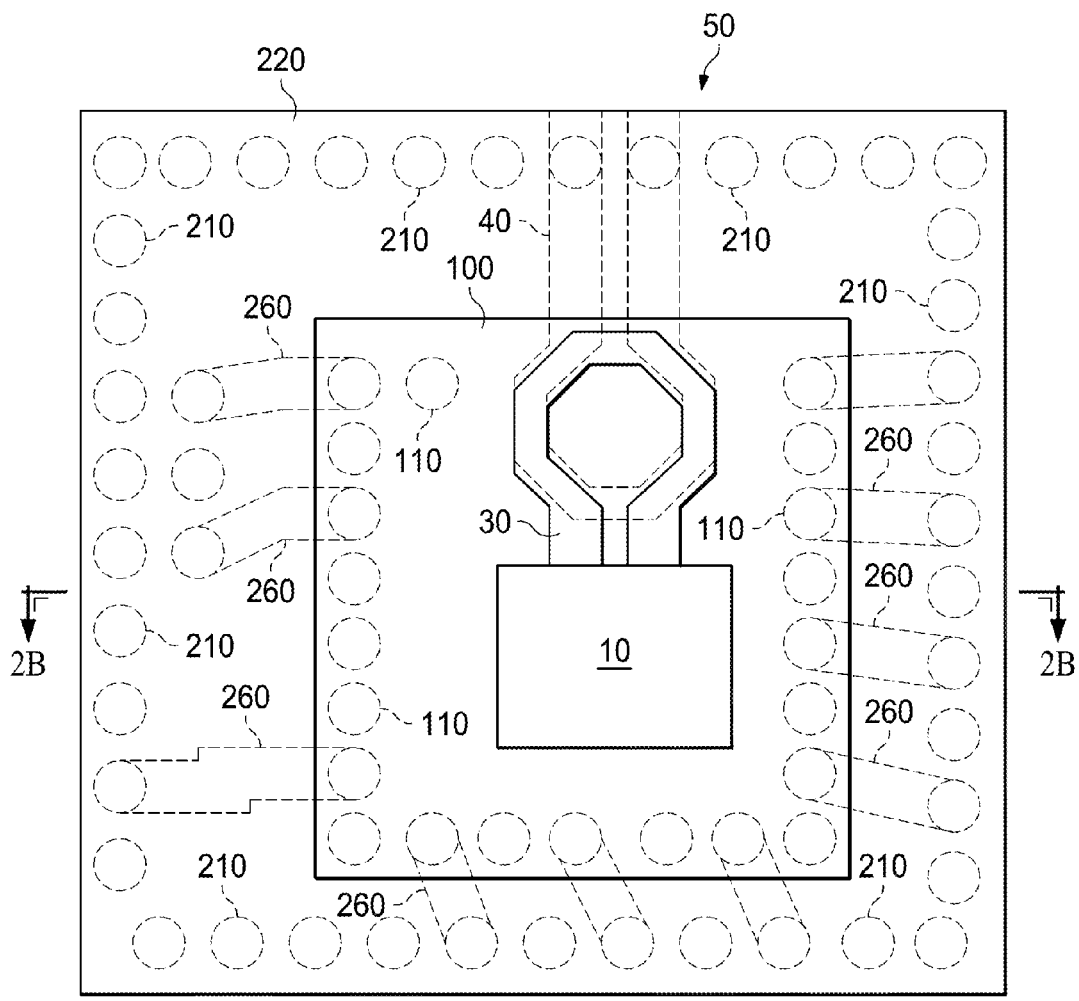
FIGS. 5A-5E, illustrates an alternative embodiment of the semiconductor package in which the transformer coils are formed over multiple metal levels.
Figure 5B:
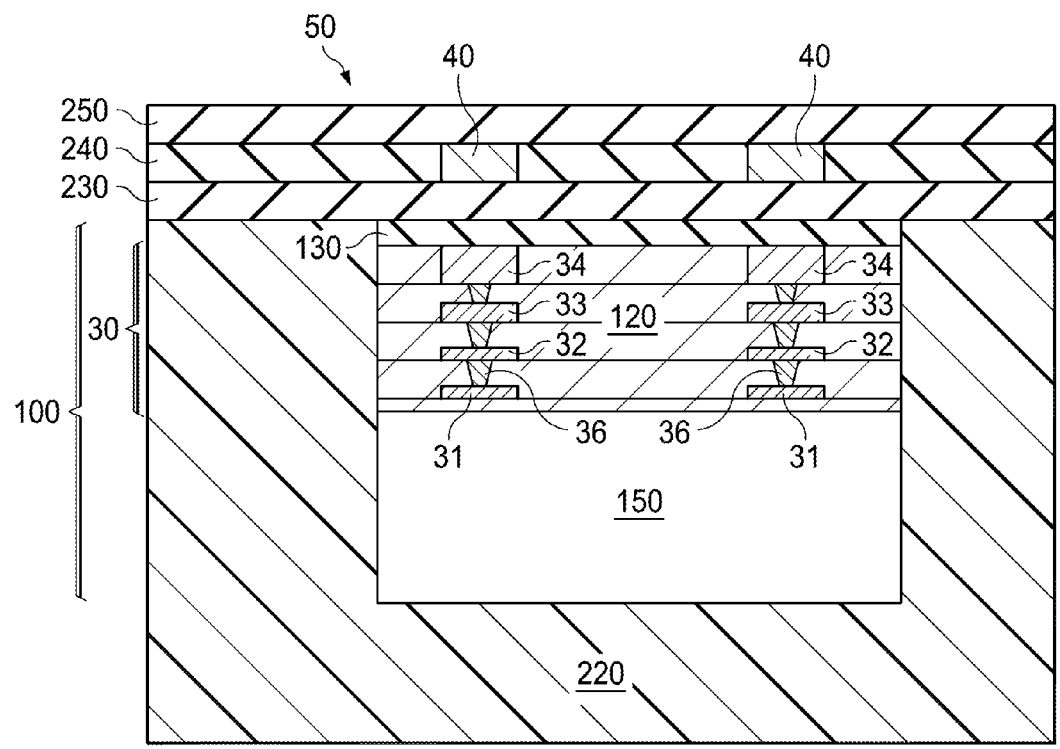

In one embodiment, the top view is similar to the embodiment described in FIG. 2. However, as illustrated in FIG. 5B in the cross-sectional view, the first coil 30 is formed over a plurality of metal levels. For example, in one embodiment, the first coil 30 has a first metal level coil 31, a second metal level coil 32, a third metal level coil 33, and a fourth metal level coil 34. Each of the metal level coils may be interconnected through vias 36. Thus, a multi-layer coil may be formed in embodiments of the invention. FIG. 5D illustrates a 3D drawing of an embodiment of the transformer where a two-layer coil implements the first coil 30 and a single-layer coil implements the second coil 40. This embodiment is an example embodiment of the embodiment described using FIG. 5B.

Figure 5C:
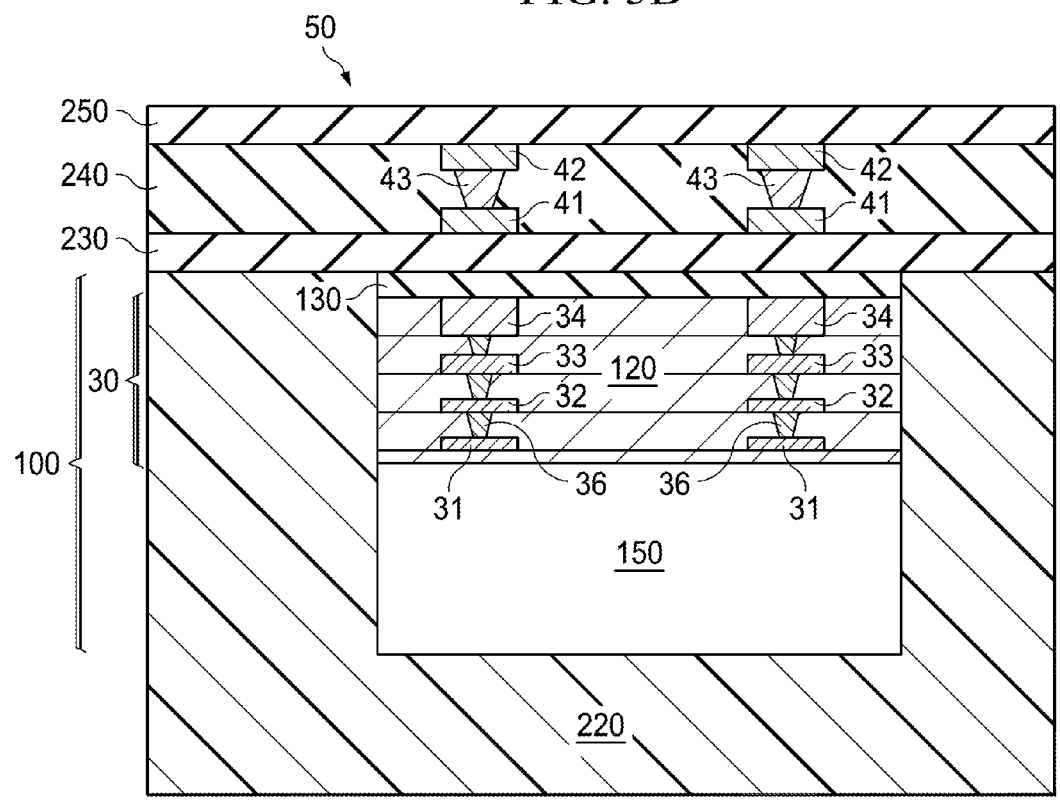
Figure 5D:
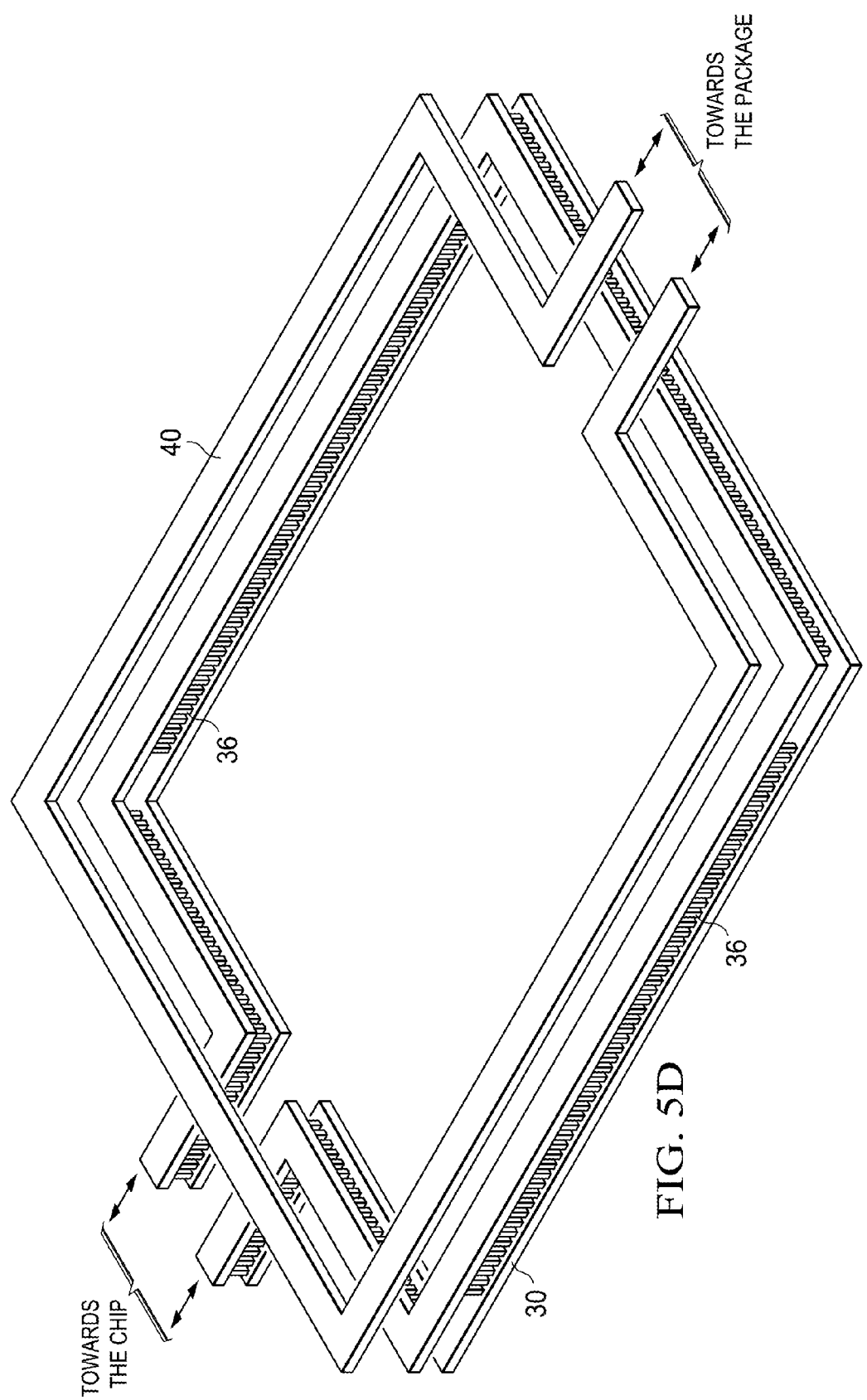
Figure 5E:
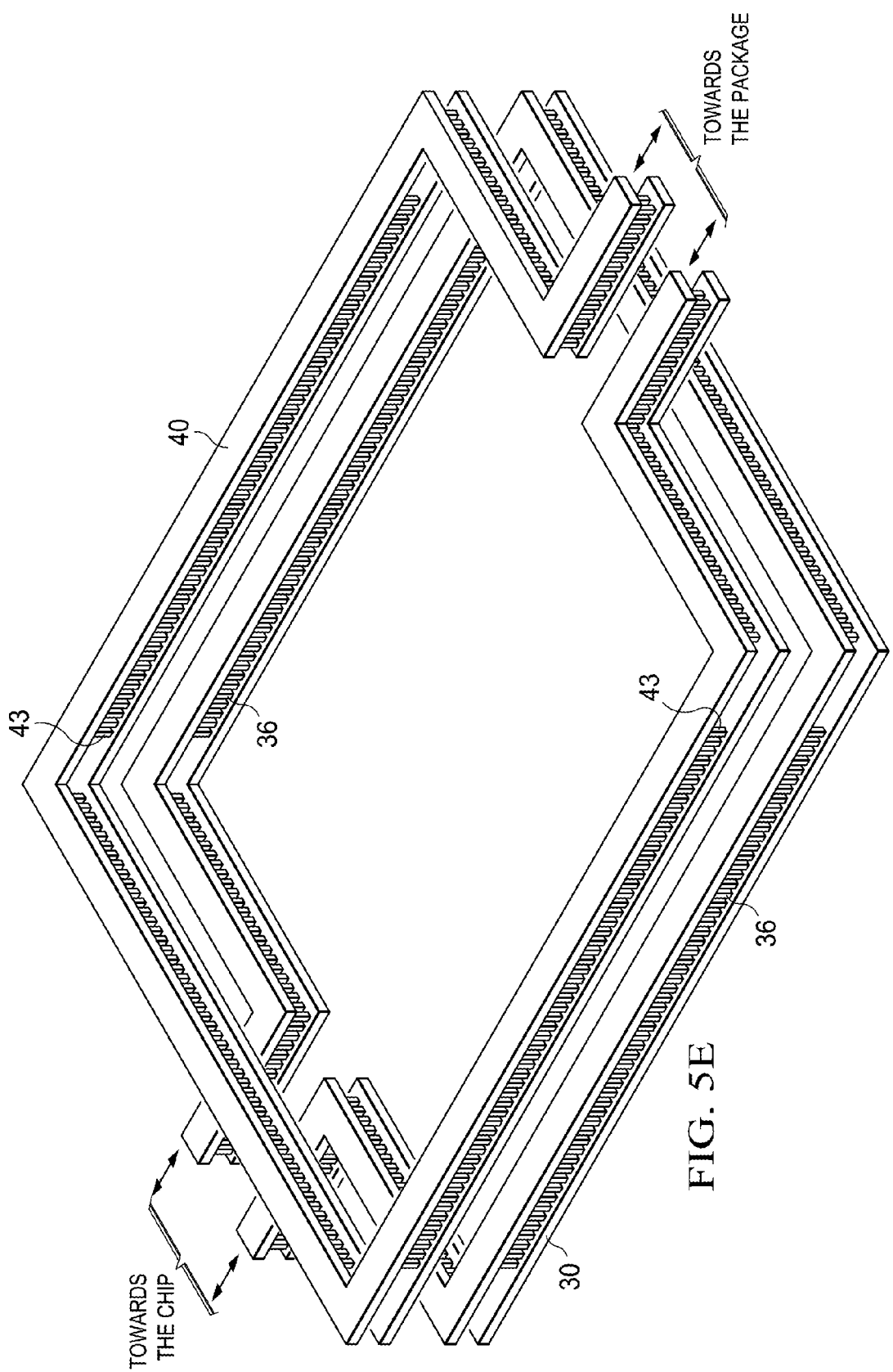

Further, in some embodiments as illustrated in FIG. 5C, the second coil 40 may also be formed in multiple metal levels over the first dielectric layer 230. For example, in one embodiment, the second coil 40 has a first redistribution level coil 41, a second redistribution level coil 42 coupled through a redistribution level via 43. The embodiments of FIG. 5 may be combined with embodiments illustrated in FIG. 4 thereby forming multi-layer and multi-turn coils in one or more embodiments. FIG. 5E illustrates a 3D drawing of an embodiment of the transformer where a two-layer coil implements the first coil 30 and a two-layer coil implements the second coil 40. FIG. 5E is one example embodiment of the embodiment described using FIG. 5C.

FIGS. 6-15 illustrate a semiconductor package during various stages of fabrication in accordance with an embodiment of the present invention.

Figure 6A:
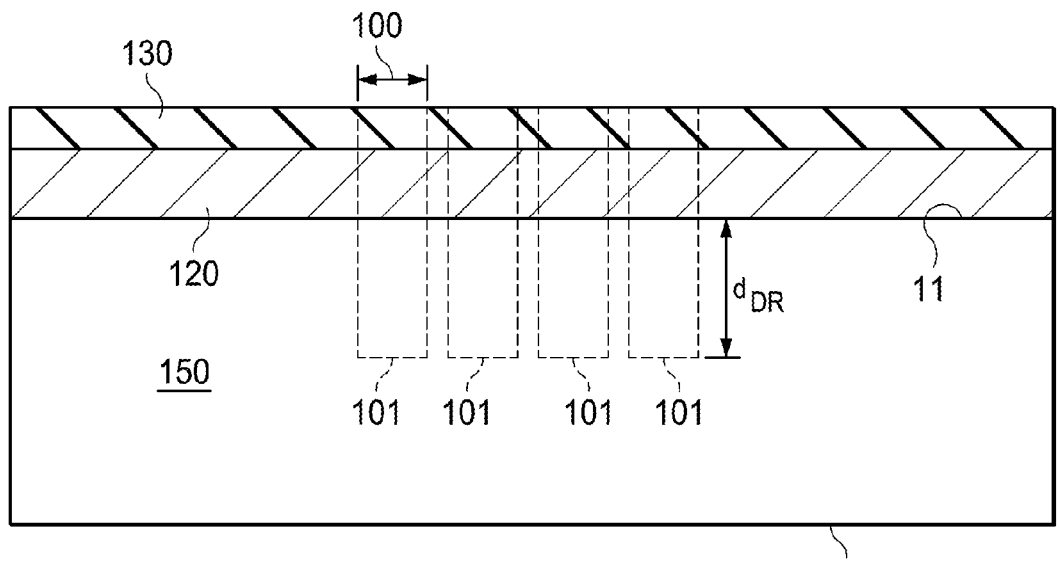
Figure 6B:
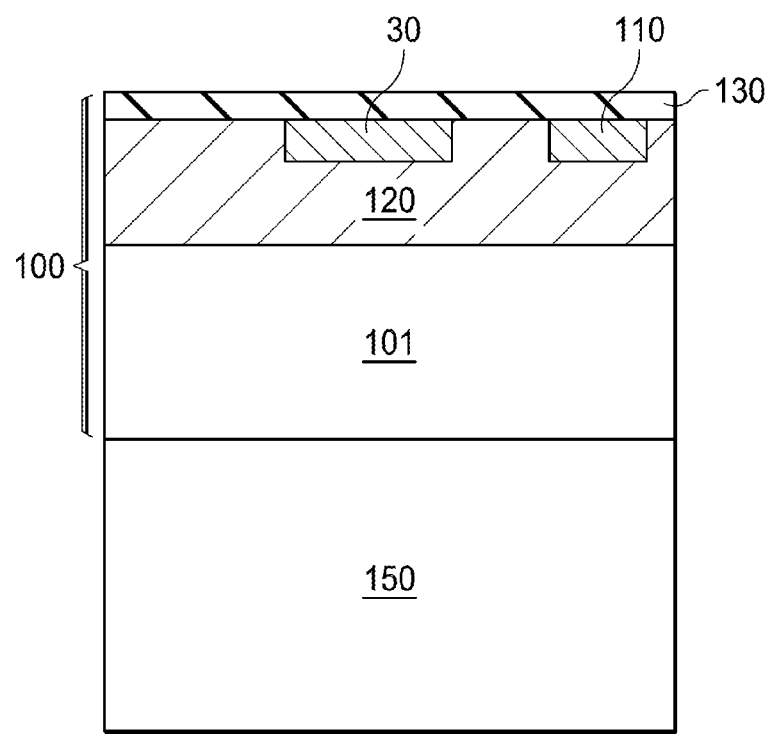
Figure 6C:
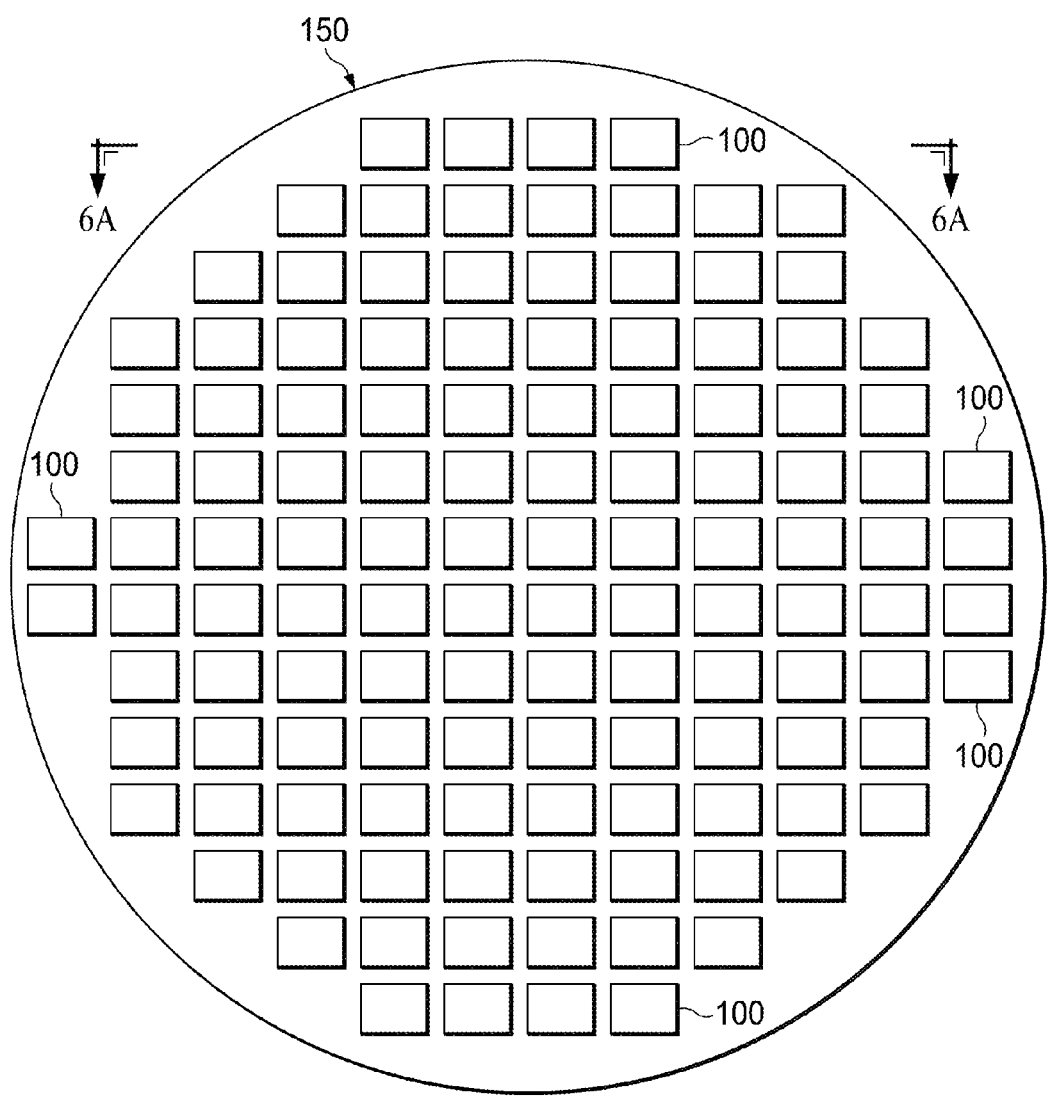

FIG. 6, which includes FIGS. 6A-6C, illustrates a semiconductor substrate after formation of device regions and metallization layers, wherein FIGS. 6A and 6B illustrates a cross-sectional view and FIG. 6C illustrates a top view.

Referring to FIG. 6A, a semiconductor substrate 150 after the completion of front end processing and back end processing is illustrated. The semiconductor substrate 150 has a plurality of semiconductor devices, i.e., chips 100, formed within. Each chip of the chips 100 may be any type of chip. For example, each of the chips 100 may be a logic chip, a memory chip, an analog chip, an RF-chip and other types of chips. Each of the chips 100 may comprise a plurality of devices such as transistors or diodes forming an integrated circuit or may be a discrete device such as a single transistor or a single diode.

The chips 100 may comprise any type of circuitry in one or more embodiments. In one or more embodiments, the semiconductor chips 100 may comprise an integrated circuit chip for wireless communication. In one or more embodiments, each of the semiconductor chips 100 comprises outputs and/or inputs for coupling to an antenna structure for wireless communication. The semiconductor chip 100 may be a silicon chip in one or more embodiments. In various embodiments the semiconductor chip 100 may be a monolithic microwave integrated circuit (MMIC) chip for microwave engineering processes. MMIC chips may perform functions such as microwave mixing, power amplification, low noise amplification, and high-frequency switching. MMIC chips may be mass-produced and are dimensionally small, for example, from around 1 mm$^2$ to about 10 mm$^2$, which enables the operation of high-frequency devices such as smart phones and cell phones, for example.

In one embodiment, the substrate 150 may comprise a semiconductor wafer such as a silicon wafer. In other embodiments, the substrate 150 may be a wafer comprising other semiconductor materials including alloys such as SiGe, SiC or compound semiconductor materials such as GaAs, InP, InAs, GaN, sapphire, silicon on insulation, for example.

Referring to FIG. 6A, device regions 101 are disposed within the substrate 150. The device regions 101 may include doped regions in various embodiments. Further, some portion of the device regions 101 may be formed over the substrate 150. The device regions 101 may include active regions such as channel regions of transistors.

The substrate 150 comprises a top surface 11 and an opposite bottom surface 12. In various embodiments, the device regions 101 are formed closer to the top surface 11 of the substrate 150 than the bottom surface 12. Active devices may be formed in an upper part of the device regions 101 of the substrate 150. Device regions 101 extends over a depth $d_{DR}$, which depending on the device, is about 10 μm to about 200 μm, and about 50 μm in one embodiment.

In various embodiments, all necessary interconnects, connections, pads etc. for coupling between devices of the device regions 101 and/or with external circuitry are formed over the substrate 150. Accordingly, a metallization layer stack 120 is formed over the substrate 150. The metallization layer stack 120 may comprise one or more levels of metallization. Each level of metallization may comprise metal lines or vias embedded within an insulating layer. The metallization layer stack 120 may comprise metal lines and vias to contact the device regions 101 and also to couple different devices within each chip 100.

FIG. 6B illustrates a magnified cross-sectional view of a single semiconductor chip 100 showing the metallization layer stack 120. A first coil 30 is formed within the metallization layer stack 120. In various embodiments, the first coil 30 is formed within the uppermost metal level of the metallization layer stack 120. The first coil 30 may be formed using a damascene or a dual damascene process in one embodiment. In one embodiment, the first coil 30 comprises copper. In an alternative embodiment, the first coil 30 comprises aluminum formed using a blanket deposition and subtractive etch process.

A passivation layer 130, which may be a protective layer, may be formed over the metallization layer stack 120 before further processing. The passivation layer 130 may be deposited or coated in various embodiments. The passivation layer 130 may comprise an oxide, nitride, polyimide, or other suitable materials known to one skilled in the art. The passivation layer 130 may comprise a hard mask in one embodiment, and a resist mask in another embodiment. The passivation layer 130 helps to protect the metallization layer stack 120 as well as the device regions 101 during subsequent processing.

Further, a final depth of the chip 100 will be determined after thinning the substrate 150. The substrate 150 may be thinned from the bottom surface 12 to expose a surface of the device regions 101.

FIG. 6C illustrates a top view of the substrate 150 comprising a plurality of chips. Each chip 100 is separated from each other by a plurality of regions called scribe lines or dicing channels. The substrate 150 may be singulated or diced along the dicing channels to form individual chips 100.

Figure 7:
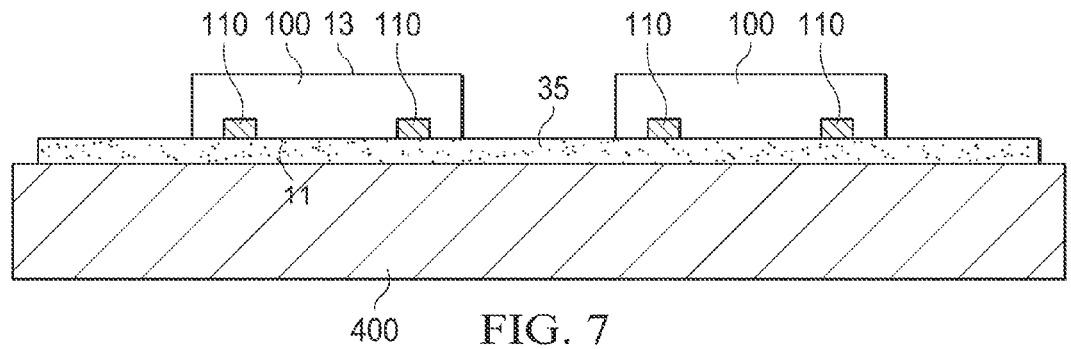
FIG. 7 illustrates a magnified cross-sectional view illustrating two of the plurality of chips during formation of a reconstituted wafer in accordance with an embodiment of the invention.

FIG. 7 illustrates a magnified cross-sectional view illustrating two of the plurality of chips 100. Referring to FIG. 7, the semiconductor chips 100 are placed over a carrier 400. In various embodiments, the top surface 11 of the semiconductor chips 100 having active regions is placed facing the carrier 400 as illustrated in FIG. 4.

The thickness of the plurality of semiconductor chips 100 from the top surface 11 to the exposed bottom surface 13 may be less than 500 μm in various embodiments. The thickness of the plurality of semiconductor chips 100 from the top surface 11 to the bottom surface 13 may be about 200 μm to about 500 μm in one or more embodiments.

Next, the plurality of semiconductor chips 100 is attached to the carrier 400, which provides mechanical support and stability during processing. In various embodiments, the carrier 400 may be a plate made of a rigid material, for example, a metal such as nickel, steel, or stainless steel, a laminate, a film, or a material stack. The carrier 400 may have at least one flat surface over which the plurality of semiconductor chips 100 may be placed. In one or more embodiments, the carrier 400 may be round or square-shaped although in various embodiments the carrier 400 may be any suitable shape. The carrier 400 may have any appropriate size in various embodiments. In some embodiments, the carrier 400 may include an adhesive tape, for example, a double sided sticky tape laminated onto the carrier 400. The carrier 400 may comprise a frame, which is an annular structure (ring shaped) with an adhesive foil in one embodiment. The adhesive foil may be supported along the outer edges by the frame in one or more embodiments.

The plurality of semiconductor chips 100 may be attached to the carrier 400 using an adhesive layer 35 in various embodiments. In various embodiments, the adhesive layer 35 may comprise glue or other adhesive type material. In various embodiments, the adhesive layer 35 may be thin, for example, less than about 100 μm in one embodiment and between 1 μm to about 50 μm in another embodiment.

Figure 8:
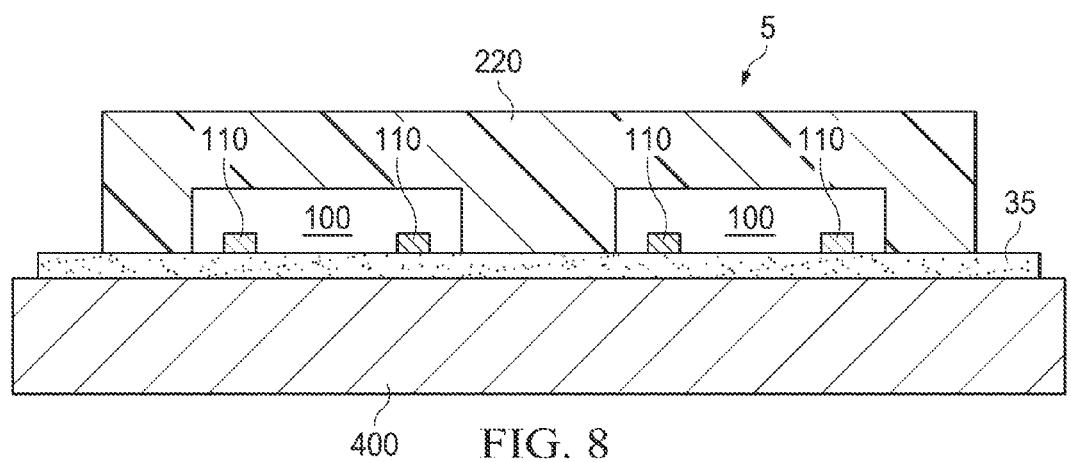
FIG. 8 illustrates the semiconductor package during fabrication after forming a reconstituted wafer in accordance with an embodiment of the invention.

FIG. 8 illustrates the semiconductor package during fabrication after forming a reconstituted wafer in accordance with an embodiment of the invention.

As illustrated in FIG. 8, an encapsulant 220 is applied over the semiconductor chips 100 and partially encloses the semiconductor chips 100. In one embodiment, the encapsulant 220 is applied using a molding process such as compression molding, transfer molding process, injection molding, granulate molding, powder molding, liquid molding, as well as printing processes such as stencil or screen printing.

In various embodiments, the encapsulant 220 comprises a dielectric material and may comprise a mold compound in one embodiment. In other embodiments, the encapsulant 220 may comprise one or more of a polymer, a copolymer, a biopolymer, a fiber impregnated polymer (e.g., carbon or glass fibers in a resin), a particle filled polymer, and other organic materials. In one or more embodiments, the encapsulant 220 comprises a sealant not formed using a mold compound, and materials such as epoxy resins and/or silicones. In various embodiments, the encapsulant 220 may be made of any appropriate duroplastic, thermoplastic, a thermosetting material, or a laminate. The material of the encapsulant 220 may include filler materials in some embodiments. In one embodiment, the encapsulant 220 may comprise epoxy material and a fill material comprising small particles of glass or other electrically insulating mineral filler materials like alumina or organic fill materials. The encapsulant 220 may be cured, i.e., subjected to a thermal process to harden thus forming a hermetic seal protecting the semiconductor chips 100. The curing process hardens the encapsulant 220 thereby forming a single substrate holding the semiconductor chips 100. Such a substrate is referred as a reconstituted wafer 5, which may be used to form a fan-out package using embedded wafer level packaging.

Embedded wafer level packaging is an enhancement of the standard wafer level packaging in which packaging is realized on an artificial wafer using wafer-like fabrication processes in which multiple packages are packaged using a common reconstituted wafer 5. As described previously, in a fan-out type package at least some of the external contact pads and/or conductor lines connecting the semiconductor chip 100 to the plurality of external contact pads 210 are located laterally outside of the outline of the semiconductor chip 100 or at least intersect the outline of the semiconductor chip 100. Thus, in fan-out type packages, a peripherally outer part of the package of the semiconductor chip 100 is typically (additionally) used for electrically bonding the package to external applications, such as application boards, etc. This outer part of the package encompassing the semiconductor chip 100 effectively enlarges the contact area of the package in relation to the footprint of the semiconductor chip 100, thus leading to relaxed constraints in view of package pad size and pitch with regard to later processing, e.g., second level assembly.

Figure 9:
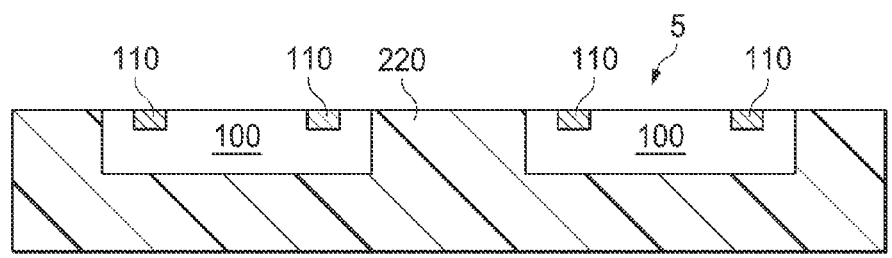
FIG. 9 illustrates the semiconductor package, during fabrication, after separating the reconstituted wafer from the carrier in accordance with an embodiment of the invention.

FIG. 9 illustrates the semiconductor package, during fabrication, after separating the reconstituted wafer from the carrier in accordance with an embodiment of the invention.

Referring to FIG. 9, the carrier 400 is removed to separate the reconstituted wafer 5 or artificial wafer. The encapsulant 220 provides mechanical and thermal stability during subsequent processing. Removing the carrier 400 also exposes the front surface of the semiconductor chip 100. During subsequent processing, the reconstituted wafer 5 may be subjected to temperatures as high as 300° C. depending on the thermal stability of the encapsulant 220 in various embodiments.

Figure 10:
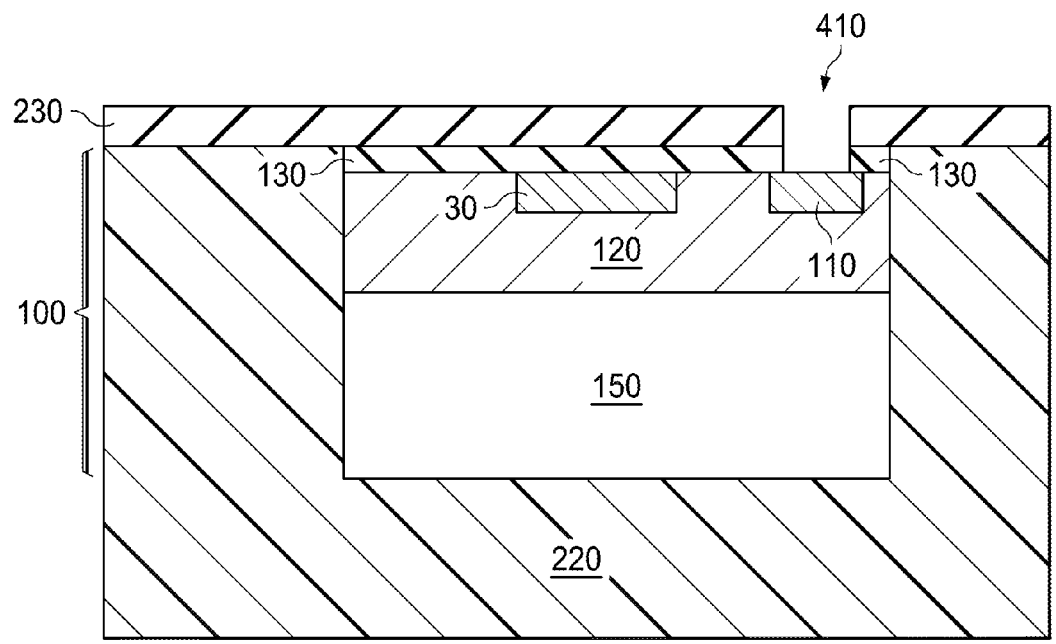
FIG. 10 illustrates a magnified cross-sectional view of the semiconductor package during fabrication after forming openings for redistribution lines to contact underlying contact pads on the semiconductor chip in accordance with an embodiment of the invention.

FIG. 10 illustrates a magnified cross-sectional view of the semiconductor package after forming openings to the chip contact pads in accordance with an embodiment of the invention. Unlike FIGS. 6-9, FIG. 7 illustrates a magnified view of a single semiconductor package.

Referring to FIG. 10, the semiconductor chip 100 may include a plurality of contact pads 110 formed within a metal layer of the metallization layer stack 120. A first dielectric layer 230 is deposited over the encapsulant 220 and the chip 100.

A first dielectric layer 230 may be formed over the reconstituted wafer 5 patterned forming openings 410 for contact pads. In various embodiments, the first dielectric layer 230 is an insulating layer and may be deposited or coated. In one or more embodiments, the first dielectric layer 230 may comprise an oxide layer or an oxide/nitride layer stack. In other embodiments, the first dielectric layer 230 may comprise silicon nitride, silicon oxynitride, FTEOS, SiCOH, polyimide, photoimide, BCB or other organic polymers, or combinations thereof. An optional insulating liner may be formed above the first dielectric layer 230. The optional insulating liner may comprise a nitride layer, in one embodiment. In various embodiments, the optional insulating liner may comprise FTEOS, SiO$_2$, SiCOH, or other low-k materials. Using a photolithography process, the first dielectric layer 230 is patterned to open the plurality of contact pads 110, which are bond pads on a metal level of the semiconductor chips 100.

Figure 11:
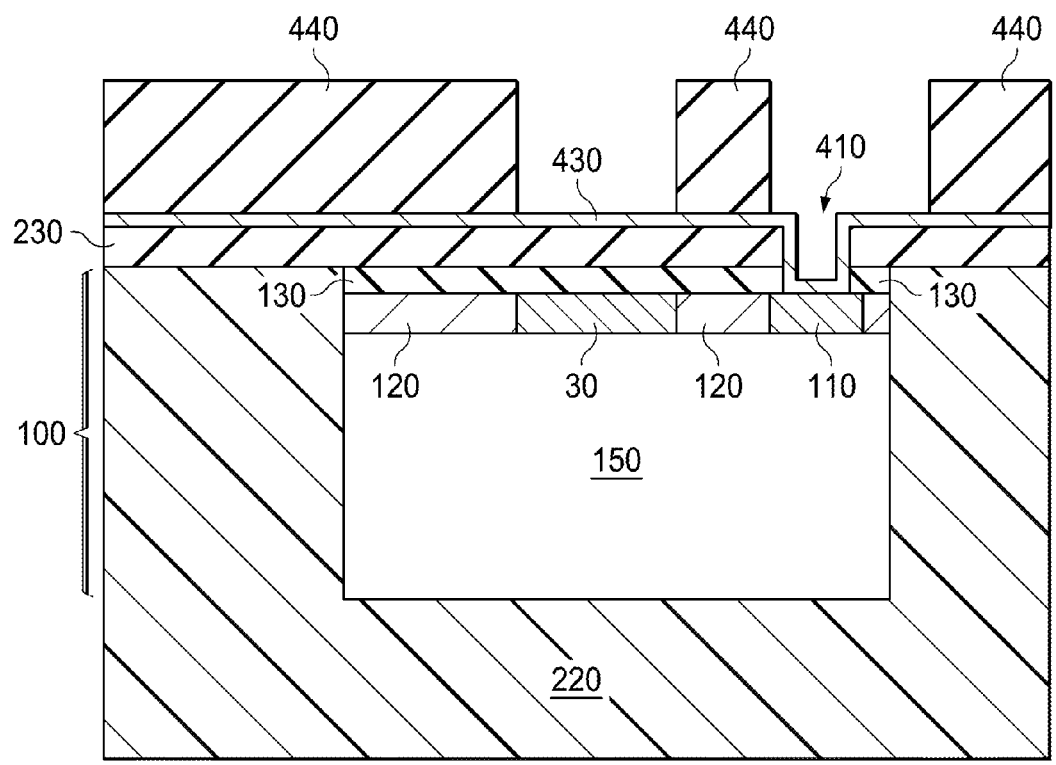
FIG. 11 illustrates a magnified view of the semiconductor package after fabrication of a seed layer for a redistribution layer in accordance with an embodiment of the invention.

FIG. 11 illustrates a magnified view of the semiconductor package after fabrication of a seed layer for a redistribution layer in accordance with an embodiment of the invention.

Referring to FIG. 11, a conductive liner 430 is deposited. In various embodiments, the conductive liner 430 is deposited using a deposition process to form a conformal layer. The conductive liner 430 may comprise a diffusion barrier and a conductive seed layer in various embodiments. The diffusion barrier may comprise Ti, Ta, Ru, W, combinations thereof, or a nitride, silicide, carbide thereof. Examples of such combinations include TiN, TaN, and WN, and TiW. In various embodiments, the conductive liner 430 is deposited using a chemical vapor deposition, plasma vapor deposition or atomic layer deposition. In various embodiments, the diffusion barrier comprises a thickness of about 20 nm to about 200 nm. The conductive liner 430 may be a diffusion barrier metal and prevents out-diffusion of copper from the last metal line of the redistribution metallization layer as well as prevents intermixing with further metallic layers.

In various embodiments, the conductive seed layer is deposited using a deposition process to form a conformal layer. In various embodiments, the conductive seed layer is deposited using a chemical vapor deposition, plasma vapor deposition or atomic layer deposition. In various embodiments, the conductive seed layer comprises a thickness of about 20 nm to about 200 nm. The conductive seed layer provides the seed layer for the growth during the subsequent electroplating process. In various embodiments, the conductive seed layer may comprise copper or other metals like Al, W, Ag, Au, Ni, or Pd.

As next illustrated in FIG. 11, a thick photo resist layer 440 is deposited over the conductive liner 430. In various embodiments, the photo resist layer 440 is several microns thick, and varies from about 1 μm to about 10 μm, in one embodiment. After deposition, the photo resist layer 440 fills the openings 410 previously formed in the first dielectric layer 230. The photo resist layer 440 is exposed and developed. The patterned photo resist layer 440 comprises patterns for both redistribution metal lines and contact pads. As a consequence, the photo resist layer 440 is removed in regions allocated to form the second coil of the transformer.

Figure 12:
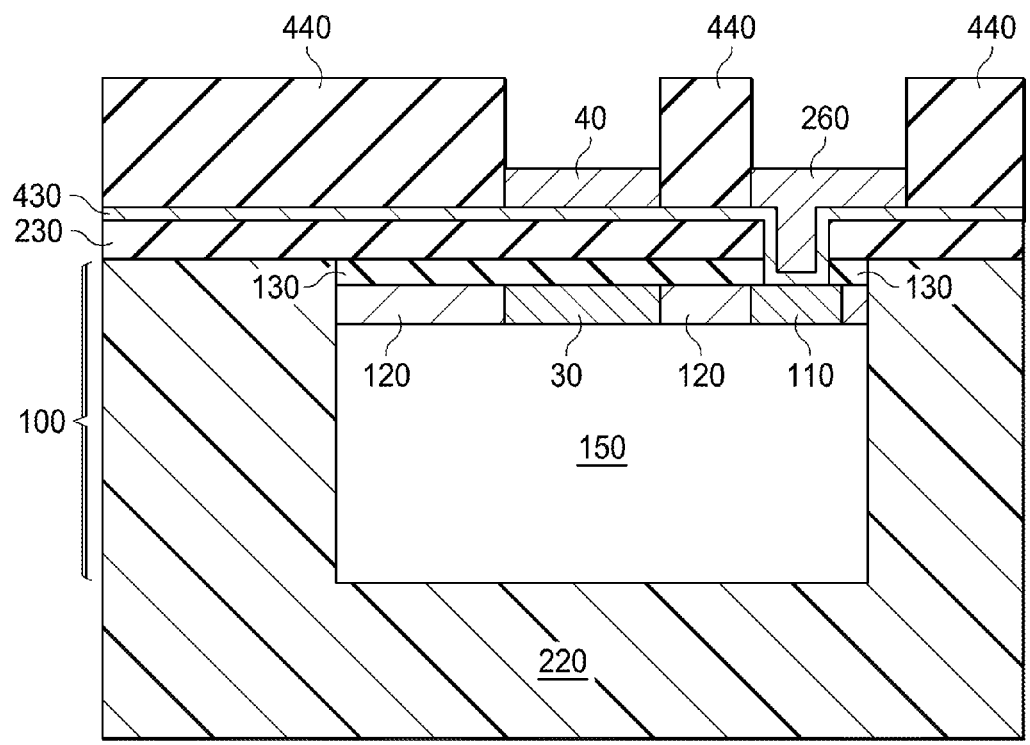
FIG. 12 illustrates a magnified view of the semiconductor package after fabrication of a redistribution layer in accordance with an embodiment of the invention.

FIG. 12 illustrates a magnified view of the semiconductor package after fabrication of a redistribution layer in accordance with an embodiment of the invention.

Referring next to FIG. 12, redistribution lines 260 and a second coil 40 are formed by electroplating a fill metal over the conductive liner 430 exposed between the patterned photo resist layer 440. In various embodiments, the fill metal comprises copper, although in some embodiments, other suitable conductors are used. The seed layer of the conductive liner 430 may comprise the same material as the material of the subsequent metal lines to enable electroplating, in one embodiment. In various embodiments, the redistribution lines 260 may comprise multiple layers, for example, Cu/Ni, Cu/Ni/Pd/Au, Cu/NiMoP/Pd/Au, or Cu/Sn, in one embodiment.

The patterned photo resist layer 440 is stripped to expose the conductive liner 430. The exposed conductive liner 430 is selectively etched and removed, for example, using a wet etch chemistry.

Figure 13:
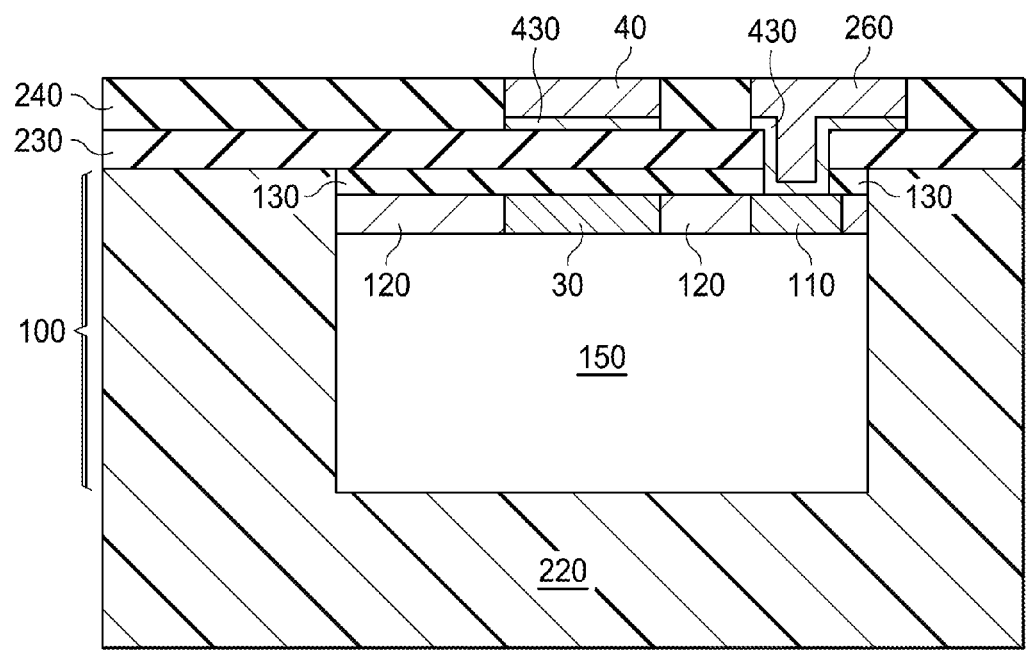
FIG. 13 illustrates a magnified view of the semiconductor package after forming a protective dielectric layer around the redistribution lines in accordance with an embodiment of the invention.

FIG. 13 illustrates a magnified view of the semiconductor package after forming a protective dielectric layer around the redistribution lines in accordance with an embodiment of the invention.

A second dielectric layer 240 is formed over the first dielectric layer 230. The second dielectric layer 240 surrounds the redistribution lines 260 and the second coil 40 in various embodiments. The second dielectric layer 240 may be deposited or coated in various embodiments. The second dielectric layer 240 may comprise a same material as the first dielectric layer 230 in one or more embodiments. Alternatively, the second dielectric layer 240 may comprise a different material. The structure at this stage is illustrated in FIG. 13 and includes redistribution lines 260 and the second coil 40.

Figure 14:
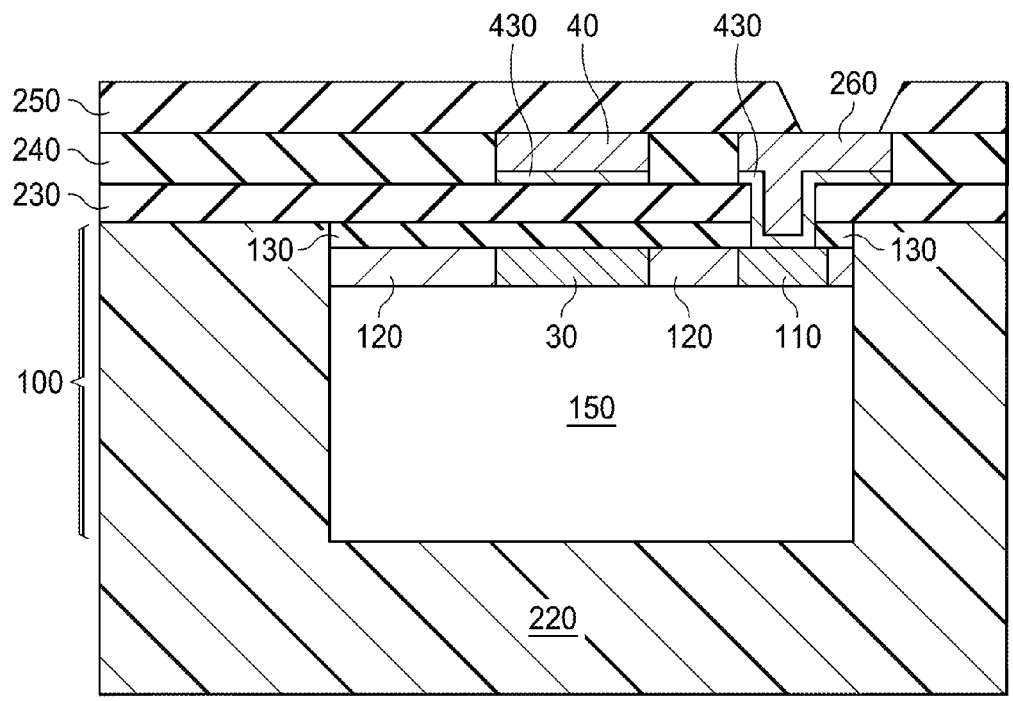
FIG. 14 illustrates a magnified view of the semiconductor package after forming openings for contacts in a dielectric layer in accordance with an embodiment of the invention.

FIG. 14 illustrates a magnified view of the semiconductor package after forming openings for contacts in a dielectric layer in accordance with an embodiment of the invention.

A third dielectric layer 250 is formed over the second dielectric layer 240. The third dielectric layer 250 may be deposited or coated in various embodiments. Openings for solder contacts are made within the third dielectric layer 250.

Figure 15:
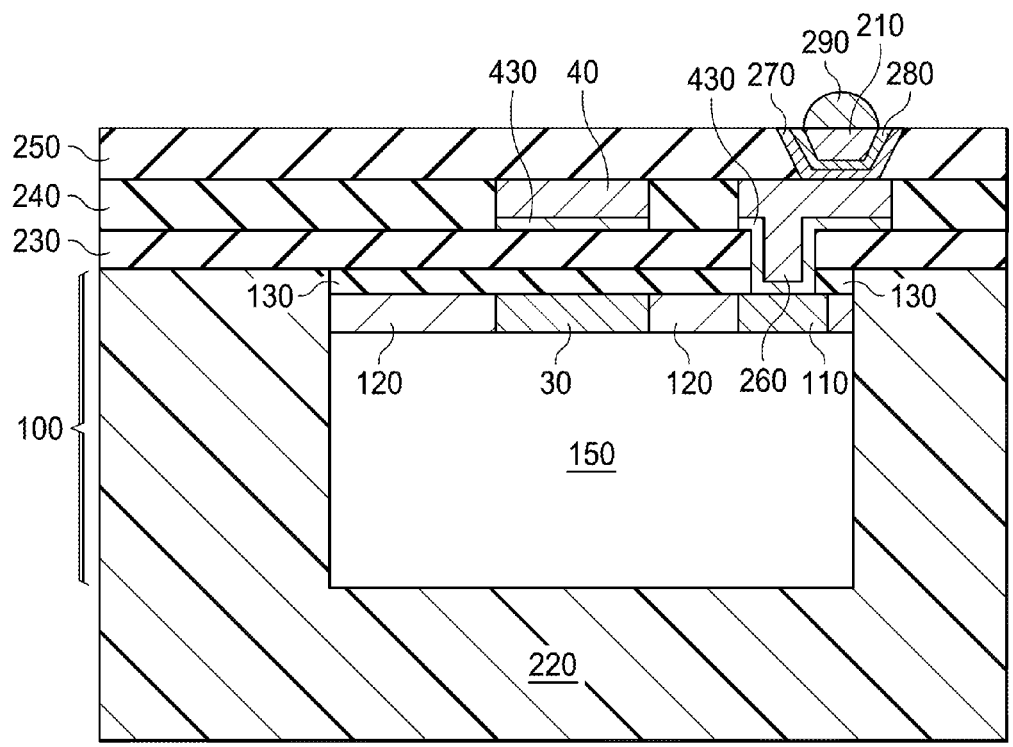
FIG. 15 illustrates a magnified view of the semiconductor package after forming solder ball contacts in accordance with an embodiment of the invention.

FIG. 15 illustrates a magnified view of the semiconductor package after forming solder ball contacts in accordance with an embodiment of the invention.

In one or more embodiments, a solder flux and a solder material may be deposited within the openings in the third dielectric layer 250. The solder material may be electroplated, although, in other embodiments, other processes such as electroless plating or deposition processes such as vapor deposition may also be used. The solder material may be a single layer or comprise multiple layers with different compositions. For example, in one embodiment, the solder material may comprises a lead (Pb) layer followed by a tin (Sn) layer. In another embodiment, a SnAg may be deposited as the solder material. Other examples include SnPbAg, SnPb, PbAg, PbIn, and lead free materials such as SnBi, SnAgCu, SnTn, and SiZn. In various embodiments, other suitable materials may be deposited.

A thermal treatment may be performed to form the solder balls 290 illustrated in FIG. 15. The thermal treatment reflows the solder material and the heating forms the solder balls 290. For example, in the embodiment when Pb/Sb layer is deposited, after reflow, high lead alloys including 95 Pb/5 Sn (95/5) or 90 Pb/10 Sn (95/10) with melting temperatures in excess of 300° C. are formed. In a different embodiment, eutectic 63 Pb/37 Sn (63/37) with a melting temperature of 183° C. is formed. Similarly, lead free solder balls 290 may be formed having a composition of 97.5 Sn/2.6 Ag (97.5/2.5). The solder balls 290 comprise a homogeneous material and have a well-defined melting temperature. For example, the high melting Pb/Sn alloys are reliable metallurgies which are resistant to material fatigue. The metal from the plurality of external contact pads 210 may also diffuse and intermix during the thermal treatment in some embodiments.

The reconstituted wafer 5 may now be thinned and singulated to form individual semiconductor packages.

Figure 16A:
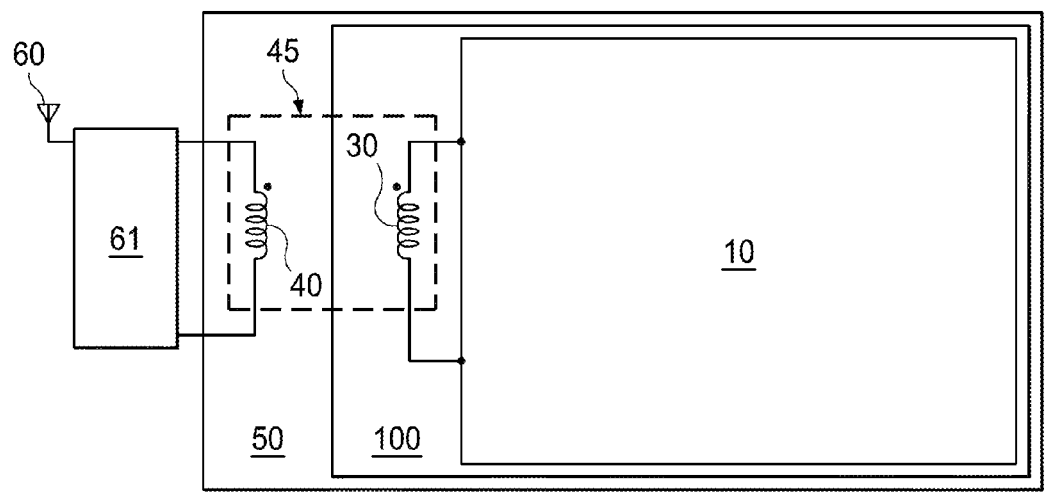
FIGS. 16A and 16B, illustrates a circuit schematic of a semiconductor package in accordance with an alternative embodiment of the present invention.
Figure 16B:
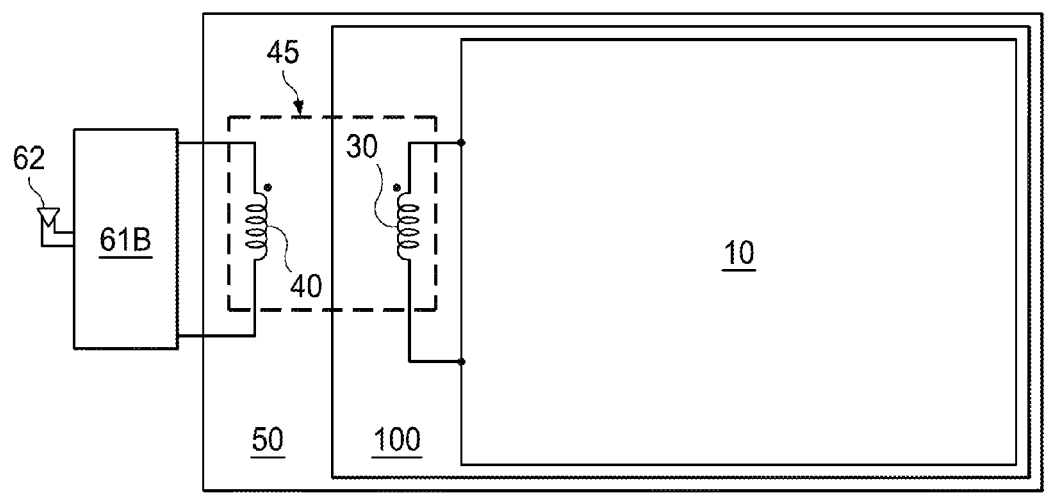

FIG. 16, which includes FIGS. 16A and 16B, illustrates a circuit schematic of a semiconductor package in accordance with an alternative embodiment of the present invention.

In this embodiment, the second coil 40 is also a differential coil. Therefore, unlike the embodiment illustrated in FIG. 1, in this embodiment, none of the ends of the second coil 40 is connected to a ground potential. For example, both the ends of the second coil 40 may be coupled to a antenna component 61 coupled to the antenna 60. For example, in one case illustrated in FIG. 16A, the conversion from differential signal to single ended signal may be performed within the antenna component 61, which may be part of the printed circuit board or may be a standalone unit. As discussed in prior embodiments, the second coil 40 is outside the chip 100 while the first coil 30 is within the chip 100.

In another embodiment illustrated in FIG. 16B, the second coil 40 may be connected directly or by a coupling component 61B to a differential antenna 62, which may be part of the printed circuit board or may be a stand-alone device in various embodiments.

Figure 17:
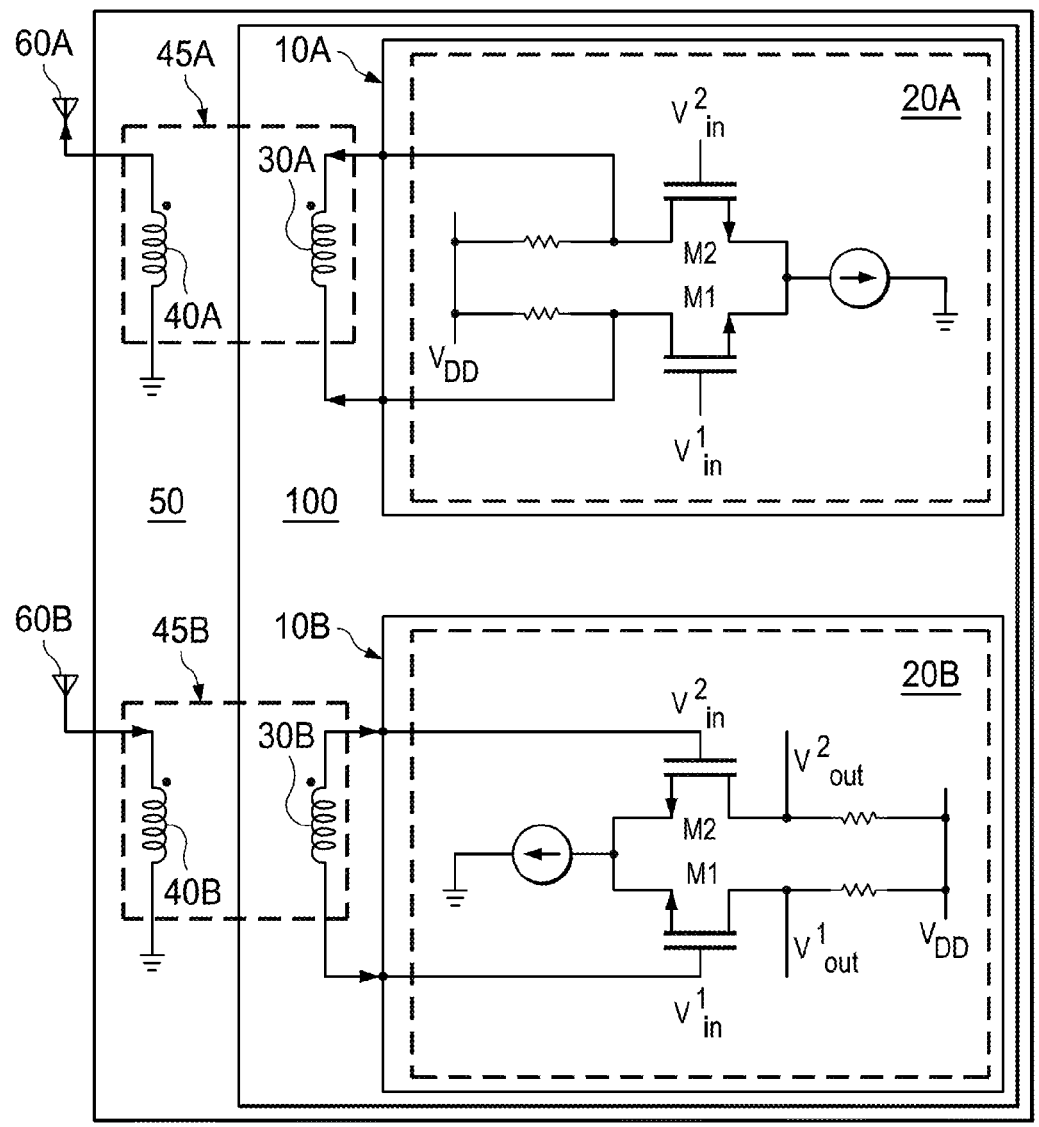
FIG. 17 illustrates a circuit schematic of a semiconductor package illustrating both a receiver and a transmitter in accordance with an alternative embodiment of the present invention.

FIG. 17 illustrates a circuit schematic of a semiconductor package illustrating both a receiver and a transmitter in accordance with an alternative embodiment of the present invention.

The transmitter circuitry is illustrated by the suffix "A" while the receiver circuitry is illustrated by the suffice "B." Thus, a transmitter side transformer 45A includes a first transmitter coil 30A and a second transmitter coil 40A while a receiver side transformer 45B includes a first receiver coil 30B and a second receiver coil 40B. Similarly, a transmitter side front-end circuit 10A is coupled to the transmitter side transformer 45A while a receiver side front-end circuit 10A is coupled to the receiver side transformer 45B. The transmitter side front-end circuit 10A may include a first differential signal circuit 20A while the receiver side front-end circuit 10B a second differential signal circuit 20B.

Gain losses due to differential-to-single-ended conversions and vice versa have different effects on the transmitter side front-end circuit 10A and the receiver side front-end circuit 10B. For example, the input loss due to the signal conversion in the receiver side turns into noise figure degradation (conversion loss in dB is noise figure in dB) since signal amplification is provided only after conversion. This noise figure degradation cannot be compensated anymore and therefore this noise affects the overall performance of the receiver side front-end circuit 10B. However, for the differential-to-single-ended conversion at the transmitter side front-end circuit 10A, the signal loss can be almost completely compensated by a gain increase in the transmitter chain, which may be, for example, achieved by increasing the current.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. As an illustration, the embodiments described in FIG. 1-15 may be combined with each other in various embodiments. It is therefore intended that the appended claims encompass any such modifications or embodiments.

Although the present invention and its advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming a semiconductor package comprising:
   providing a semiconductor chip comprising a first coil;
   forming a reconstituted wafer by encapsulating the semiconductor chip with an encapsulant;
   forming a dielectric layer above the encapsulant and the semiconductor chip;
   forming a second coil disposed above the dielectric layer, the first coil being magnetically coupled to the second coil; and
   forming a metal line electrically coupled to the first coil in the semiconductor chip, the metal line being magnetically coupled to the second coil.

2. The method of claim 1, further comprising:
   forming a plurality of contact pads in the semiconductor chip;
   forming a plurality of external contact pads above the encapsulant; and
   forming a redistribution line coupling a pad of the plurality of contact pads with a pad of the plurality of external contact pads, the redistribution line and the second coil disposed in a same redistribution layer.

3. The method of claim 1, further comprising a second dielectric layer disposed within the semiconductor chip, the second dielectric layer disposed between the dielectric layer and the first coil.

4. The method of claim 1, wherein the first coil has a first end and a second end, the first end being coupled to a ground potential node.

5. The method of claim 4, wherein the second end is coupled to a node coupled to receiver/transmitter input/output node of an antenna.

6. The method of claim 1, wherein the second coil has a first end and a second end, the first end being coupled to a first differential input/output node and the second end being coupled to a second differential input/output node.

7. The method of claim 1, wherein the semiconductor chip comprises a differential signal input/output interface, and wherein the semiconductor package comprises a single-ended signal input/output interface.

8. A method of forming a semiconductor device, the method comprising:
   forming a first coil of a transformer within a metallization layer stack of a semiconductor chip;
   forming a reconstituted wafer by encapsulating the semiconductor chip with an encapsulant;
   forming a second coil of the transformer within an insulating material in a redistribution layer in the reconstituted wafer, the second coil being formed outside the semiconductor chip;
   forming a plurality of contact pads in the semiconductor chip;
   forming a plurality of external contact pads disposed on an exposed surface of the semiconductor device; and
   coupling a pad of the plurality of contact pads with a pad of the plurality of external contact pads with a redistribution line, the redistribution line and the second coil being disposed in a same redistribution layer.

9. The method of claim 8, wherein the first coil is coupled to a receiver/transmitter node of the semiconductor device.

10. The method of claim 8, wherein the second coil is coupled to a differential pair signal circuit.

11. The method of claim 8, wherein the transformer is configured to implement a differential to single ended conversion.

12. The method of claim 8, wherein the transformer is configured to implement a differential to differential operation.

13. The method of claim 8, wherein the first coil is disposed in more than one metal level within the semiconductor chip.

14. The method of claim 8, wherein the second coil is disposed in more than one level of a redistribution layer of the semiconductor device.

15. The method of claim 8, wherein the first coil is a multi-turn coil.

16. The method of claim 8, wherein the second coil is a multi-turn coil.

17. The method of claim 8, further comprising dicing the reconstituted wafer after forming the second coil to form the semiconductor package comprising the first coil and the second coil.

18. A method of forming a semiconductor package, the method comprising:
    forming a semiconductor chip having a first coil disposed in an uppermost metal level;
    forming a reconstituted wafer comprising the semiconductor chip;
    forming a dielectric layer over the reconstituted wafer; and
    forming a second coil over the dielectric layer, the second coil being configured to magnetically couple with the first coil.

19. The method of claim 18, further comprising:
    coupling a first differential output of a differential signal from the semiconductor chip to a first end of the first coil; and
    coupling a second differential output of the differential signal to a second end of the first coil.

20. The method of claim 18, further comprising coupling one end of the second coil to a ground potential node.

21. The method of claim 18, further comprising singulating the reconstituted wafer after forming the second coil.

22. The method of claim 18, wherein forming the semiconductor chip having the first coil disposed in the uppermost metal level comprises forming the first coil within the upper metal level and a metal level lower than the upper metal level.

23. The method of claim 18, further comprising forming redistribution lines in the dielectric layer.

24. The method of claim 18, further comprising coupling each end of the second coil to an external contact pad.

25. A method of forming a semiconductor package, the method comprising:
    forming a semiconductor chip within an encapsulant;
    forming a first coil in the semiconductor chip;
    forming a dielectric layer above the encapsulant and the semiconductor chip; and
    forming a second coil above the dielectric layer, the first coil being magnetically coupled to the second coil;
    forming a plurality of contact pads in the semiconductor chip;
    forming a plurality of external contact pads above the encapsulant; and
    forming a redistribution line coupling a pad of the plurality of contact pads with a pad of the plurality of external contact pads, the redistribution line and the second coil being formed in a same redistribution layer.

26. The method of claim 25, wherein the first coil has a first end and a second end, wherein the first end is coupled to a ground potential node, and wherein the second end is coupled to a node coupled to receiver/transmitter input/output node of an antenna.

27. The method of claim 25, wherein the second coil has a first end and a second end, the first end being coupled to a first differential input/output node and the second end being coupled to a second differential input/output node.

28. The method of claim 25, wherein the semiconductor chip comprises a differential signal input/output interface, and wherein the semiconductor package comprises a single-ended signal input/output interface.

29. The method of claim 25, further comprising forming a third coil in the semiconductor chip below the first coil, the third coil electrically coupled to the first coil.

30. The method of claim 25, further comprising forming a third coil above the second coil, the third coil electrically coupled to the second coil.

* * * * *